United States Patent [19]
Laviron et al.

[11] Patent Number: 4,547,861
[45] Date of Patent: Oct. 15, 1985

[54] COMBINED LOGIC SIGNALS GENERATOR

[75] Inventors: André Laviron, Fontaine les Dijon; Claude Berard, Is sur Tille, both of France

[73] Assignee: Commissariat a l'Energie Atomique, Paris, France

[21] Appl. No.: 342,223

[22] Filed: Jan. 25, 1982

[30] Foreign Application Priority Data

Jan. 26, 1981 [FR] France ............... 81 01392

[51] Int. Cl.[4] ............................................. G06F 7/38
[52] U.S. Cl. .................................... 364/715; 371/27
[58] Field of Search ............ 364/718, 578, 579, 580, 364/715; 371/23, 27; 340/146.2; 324/73 AT, 73 R

[56] References Cited

U.S. PATENT DOCUMENTS

| | | | |
|---|---|---|---|
| 3,371,320 | 2/1968 | Lachenmayer | 340/172.5 |
| 3,775,598 | 11/1973 | Chao et al. | 371/23 |
| 3,832,535 | 8/1974 | De Vito | 324/73 AT |
| 3,961,250 | 6/1976 | Snethen | 371/23 |
| 3,988,670 | 10/1976 | Gariazzo | 324/73 AT |
| 4,388,719 | 6/1983 | Soltysik et al. | 324/73 R |

OTHER PUBLICATIONS

"The Computer Journal", vol. 6, No. 3, Oct. 1963.

Primary Examiner—Gary Chin
Assistant Examiner—Thomas G. Black
Attorney, Agent, or Firm—Oblon, Fisher, Spivak, McClelland & Maier

[57] ABSTRACT

A combined logic signal generator enables combination of p output signals at logic level 1 and N-p output signals at the logic level 0 among N outputs (QP1, ... QPN) of the generator on which the p logic signals of level 1 and N-p logic signals of level 0 are available with Np being constant. The generator utilizes an assembly (P) of N storage parts (P1, P2, ... PN) and a device CH for introducing into the storage means P1, P2 ... PN the logic levels of signals corresponding to a predetermined combination and a control means M to manage the storage means of the assembly P to obtain all the combinations which follow the predetermined starting combination. Lastly, the system utilizes a device A for stopping the generation of the combinations after a second predetermined combination.

20 Claims, 10 Drawing Figures

|  |  | $QP_1$ | $QP_2$ | $QP_3$ | $QP_4$ | $QP_5$ |
|---|---|---|---|---|---|---|
| $i=3$ | $n=2$ | 1 | 1 | 1 | 0 | 0 |
| $i=2$ | $n=1$ | 1 | 1 | 0 | 1 | 0 |
| $i=1$ | $n=0$ | 1 | 0 | 1 | 1 | 0 |
| $i=4$ | $n=2$ | 0 | 1 | 1 | 1 | 0 |
| $i=2$ | $n=1$ | 1 | 1 | 0 | 0 | 1 |
| $i=1$ | $n=0$ | 1 | 0 | 1 | 0 | 1 |
| $i=3$ | $n=1$ | 0 | 1 | 1 | 0 | 1 |
| $i=1$ | $n=0$ | 1 | 0 | 0 | 1 | 1 |
| $i=2$ | $n=0$ | 0 | 1 | 0 | 1 | 1 |
|  |  | 0 | 0 | 1 | 1 | 1 |

FIG. 2

|  | $QP_0$ | $QP_1$ | $QP_2$ | $QP_3$ | $QP_4$ | $QP_5$ |
|---|---|---|---|---|---|---|
| $t=2$ | 0 | 1 | 1 | 1 | 0 | 0 |
| $t=3$ | 1 | 0 | 1 | 1 | 0 | 0 |
| $t=4$ | 1 | 1 | 0 | 1 | 0 | 0 |
| $t=2$ | 0 | 1 | 1 | 0 | 1 | 0 |

FIG. 3

|   |            | $QP_0$ | $QP_1$ | $QP_2$ | $QP_3$ | $QP_4$ | $QP_5$ | CPPO |
|---|------------|--------|--------|--------|--------|--------|--------|------|
| A | RAZ P INIT | 1 | 0 | 0 | 0 | 0 | 0 |   |
|   | RAZ F INIT | 1 | 0 | 0 | 0 | 0 | 0 | 4 |
|   | p.CP INIT  | 1 | 1 | 1 | 1 | 0 | 0 | 1 |
|   | RAZ F INIT | 1 | 1 | 1 | 1 | 0 | 0 | 4 |
|   | RAZ $QP_0$ | 0 | 1 | 1 | 1 | 0 | 0 | 4 |
| B | CP CF      | 1 | 0 | 1 | 1 | 0 | 0 | 3 |
|   | CP CF      | 1 | 1 | 0 | 1 | 0 | 0 | 2 |
|   | CP RAZ F   | 0 | 1 | 1 | 0 | 1 | 0 | 4 |
| C | CP CF      | 1 | 0 | 1 | 0 | 1 | 0 | 3 |
|   | CP RAZ F   | 0 | 1 | 0 | 1 | 1 | 0 | 4 |
| D | CP CF      | 0 | 0 | 1 | 1 | 1 | 0 | 3 |
| E | CP CF      | 1 | 0 | 0 | 1 | 1 | 0 | 2 |
|   | CP CF      | 1 | 1 | 0 | 0 | 1 | 0 | 1 |
|   | CP RAZ F   | 0 | 1 | 1 | 0 | 0 | 1 | 4 |
| F | CP CF      | 1 | 0 | 1 | 0 | 0 | 1 | 3 |
|   | CP RAZ F   | 0 | 1 | 0 | 1 | 0 | 1 | 4 |
| G | CP CF      | 0 | 0 | 1 | 1 | 0 | 1 | 3 |
| H | CP CF      | 1 | 0 | 0 | 1 | 0 | 1 | 2 |
|   | CP CF      | 0 | 1 | 0 | 0 | 1 | 1 | 4 |
| I | CP CF      | 0 | 0 | 1 | 0 | 1 | 1 | 3 |
| J | CP CF      | 0 | 0 | 0 | 1 | 1 | 1 | 2 |
| K | CP CF      | 1 | 0 | 0 | 0 | 1 | 1 | 1 |
|   | CP CF      | 1 | 1 | 0 | 0 | 0 | 1 | 0 |

FIG. 4

|  |  | $QP_1$ | $QP_2$ | $QP_3$ | $QP_4$ | $QP_5$ |
|---|---|---|---|---|---|---|
| $i=2$ | $n=1$ | 1 | 1 | 0 | 0 | 0 |
| $i=1$ | $n=0$ | 1 | 0 | 1 | 0 | 0 |
| $i=3$ | $n=1$ | 0 | 1 | 1 | 0 | 0 |
| $i=1$ | $n=0$ | 1 | 0 | 0 | 1 | 0 |
| $i=2$ | $n=0$ | 0 | 1 | 0 | 1 | 0 |
| $i=4$ | $n=1$ | 0 | 0 | 1 | 1 | 0 |
| $i=1$ | $n=0$ | 1 | 0 | 0 | 0 | 1 |
| $i=2$ | $n=0$ | 0 | 1 | 0 | 0 | 1 |
| $i=3$ | $n=0$ | 0 | 0 | 1 | 0 | 1 |
|  |  | 0 | 0 | 0 | 1 | 1 |

FIG. 8

COMBINED LOGIC SIGNALS GENERATOR

BACKGROUND OF THE INVENTION

1. Field of the Invention

The invention relates to a combined logic signals generator. The generator enables all or a certain number of combinations of p logic signals at a level 1 and of N-p logic signals at a level 0 to be formed amongst the N outputs (QP1, QP2 . . . QPN) which the generator comprises (N and p are constant).

The generator is applied, for example, to the study of the consequences of the failure of components used in the safety systems of nuclear power stations by producing, in association with a logic simulator, the combinations of the failures of the various components; in this application, where the object is to describe the combinations of failing components which would cause the failure of a global system, each component of the system is simulated by logic gates, each of the gates being connected to one of the outputs QP1 . . . QPN. In dependence on the state of the means Pi, the corresponding gate simulates the passing or non-passing state (satisfactory state or failure) of the component of the system. For each of the combinations generated on the means P, the response of the simulator is analysed to find out whether it is a combination causing the failure of the global system or not. The list of these combinations is a result which then enables the global system to be analysed for dependability studies.

Clearly, however, the generator can be applied to the simulation of all the logic systems operating from the reception of logic signals of levels 0 or 1 received at their inputs. Clearly also the generator can supply combinations of p logic signals at a level 0 and N-p logic signals of level 1 amongst the N outputs which the generator comprises.

2. Description of the Prior Art

A system is known which allows the rotation, amongst the N outputs which it comprises, of all combinations of p outputs on which logic signals of level 1 are available, with the remaining N-p outputs supplying logic signals of level 0. That system comprises a binary counter of N outputs on which a sweeping is carried out of all the possible combinations of such outputs or of a certain number of such combinations; however, except for low values of N, the total number of combinations to be swept is generally very large. Moreover, the combinations, having only P logic levels 1, are worked out amongst other combinations which do not correspond to that number p of levels 1. For reasons of time and expense, all that can be done is to sweep the first combinations one by one, two by two, and p by p, on the counter outputs. Generally such combinations are obtained only from slow systems limited to low values of p, the systems being piloted by computers.

In the case of reliability studies of logic systems, the object is to find the list of failing elements which cause the total failure of the system. In the present state of the art, therefore, the simulation of logic systems is a complicated, lengthy and expensive operation.

The known system described hereinbefore comprises a binary counter with N flip-flops (P1, P2 . . . PN) and operates as follows: the lowest weight of the binary values contained in the flip-flops is the weight of the binary value contained in the flip-flop of position 1 (Pi), while the highest weight of such binary values is the weight of the binary value contained in the flip-flop of position N ($P_N$); the result is $2^N$ combinations which are all the possible combinations which exist when the levels 1 and 0 are put on the N flip-flops. On initialisation all the flip-flops of the binary counter are reset through zero. The flip-flops are of course connected to a clock which supplies pulses to them; at the first clock pulse the flip-flop $P_1$ of position 1 passes to the logic level 1. The changeover of the flip-flop $P_1$ therefore supplies two counting positions in association with the flip-flop $P_2$ which is at the logic level 0, all the other flip-flops of the counter being also at the logic level 0. Counting is continued by putting the flip-flop $P_2$ at the logic level 1 and by starting to sweep again the various possibilities offered by the flip-flop $P_1$ which can be either at the logic level 0 or at the logic level 1. The flip-flop $P_2$ therefore supplies two possibilities of choice (logic level 0 or logic level 1) which, associated with the logic level of the flip-flop $P_1$, gives two fresh possibilities—i.e., a total of 2 ex 2=4 combinations. Thus, step by step, every time all the combinations are swept, the flip-flop of the directly higher weight is set to 1, while all the flip-flops of lower weight are reset to 0. It results from these observations that, as a result of a binary counter whose outputs are swept, it is possible to obtain $2^N$ combinations.

However, the total number of combinations to be swept is very great when N has a considerable value.

SUMMARY OF THE INVENTION

It is an object of the invention to obviate these disadvantages and inter alia to provide a combined logic signals generator in which the search for a combination of signals does not demand the use of a computer carrying out complicated, lengthy and expensive sweeping of the generator output signals.

The invention relates to a combined logic signals generator for forming combinations of p output signals at the logic level 1 and N-p output signals at the logic level 1 amongst N outputs (QP1, . . . QPN) of the generator on which the p logic signals of level 1 and N-p logic signals of level 0 are available, N and p being constants, characterised in that it comprises:

an assembly (P) of N storage means (P1,P2 . . . PN), the storage means being allocated position 1 to position N, the combinations of p output signals at the logic level 1 and N-p at the logic level 0 being supplied at the outputs (QP, . . . QPN) with such storage means of positions 1 to N;

means CH to introduce into the storage means (P1,P2 . . . PN) the logical levels corresponding to a predetermined starting combination of signals;

control means M to locate the storage means Pi, which is defined as being a means whose output signal is at the logic level 1 and which is immediately followed by the storage means $P_{i+1}$ whose output signal is at the logic level 0, the position i being as low as possible, the means M enable a succession of logic levels 1 to be brought to all the storage means which possibly precede the means $P_1$, starting with a storage means of position 1 up to a means of position n inclusive, n being equal to the number of levels 1 existing on the storage means preceding the means Pi; this succession is completed if necessary with levels 0 after the storage means of position n and before the means of position i; the control means M also enable the logic level of the output signals of the storage means Pi to be replaced by a logic level 0 and the logic level of the output signals of storage means $P_{i+1}$ to be replaced by a logic level 1, the repeated application of the control means M supplying the combinations which follow the particular combinations;

means A to stop the generation of the combinations after another predetermined combination.

BRIEF DESCRIPTION OF THE DRAWINGS

Other features and advantages of the invention will be more clearly gathered from the following description, with reference to the accompanying drawings, wherein:

FIG. 2 is a table giving all the combinations of logic signals at a logic level 1 obtained at p outputs of the generator according to the invention, among the M outputs which the generator comprises, the remaining N-p outputs being at the logic level 0. It is supposed in the table that the combination generator illustrated by way of example comprises N=5 outputs and that the combinations of p=3 of such outputs are performed at the logic level 1;

FIG. 3 is a table showing in a more detailed manner the state of the flip-flops of the storage assembly P of the generator according to the invention, to pass from one combination to another in the table illustrated in FIG. 2;

FIG. 4 is a table showing the logic state of all the flip-flops of the storage assembly P of the generator according to the invention, during the obtaining of all the possible combinations by means of the generator illustrated in FIG. 1 which comprises N=5 outputs, the combined logic signals of logic level 1 being available at p=3 of such outputs;

FIG. 8 is the table showing the logic level of all the flip-flops of the storage assembly P for this second embodiment of the generator, in which p=2.

FIGS. 1A and 1B illustrate diagramatically a combined logic signals generator according to the invention. The generator enables combinations of p output signals to be formed at the logic level 1 and N-p output signals at the logic level 0, amongst the N outputs (QP1 ... QPN) which the generator comprises. In the embodiment illustrated by way of example, it is supposed that the generator comprises N=5 outputs and that it enables combinations to be formed of p=3 outputs at the logic level 1 and N-p=2 output signals at the logic level 0, amongst the 5 output signals QP1, QP2, ... QP5 of the generator. It comprises an ordered assembly P of N storage means (P1, P2 ... PN) which are allocated from position 1 to position N; the combinations of p outputs at the level 1 and of the N-p outputs at the level 0 are supplied at the output signals QP1, ... QPN of such storage means. In the embodiment illustrated in the drawing, the storage means of the assembly P are formed by flip-flops P1,P2, ... P5 of type D; they are, for instance, flip-flops of the 74LS/174 series marketed by the TEXAS Inst. Company. The combination generator also comprises means CH which will be disclosed in greater details hereinafter and which enable logic level signals corresponding to a particular combination of signals which it is desired to obtain at the outputs QP1, ... QPN of the generator to be introduced into the flip-flops of the storage assembly P.

Figure 1A:
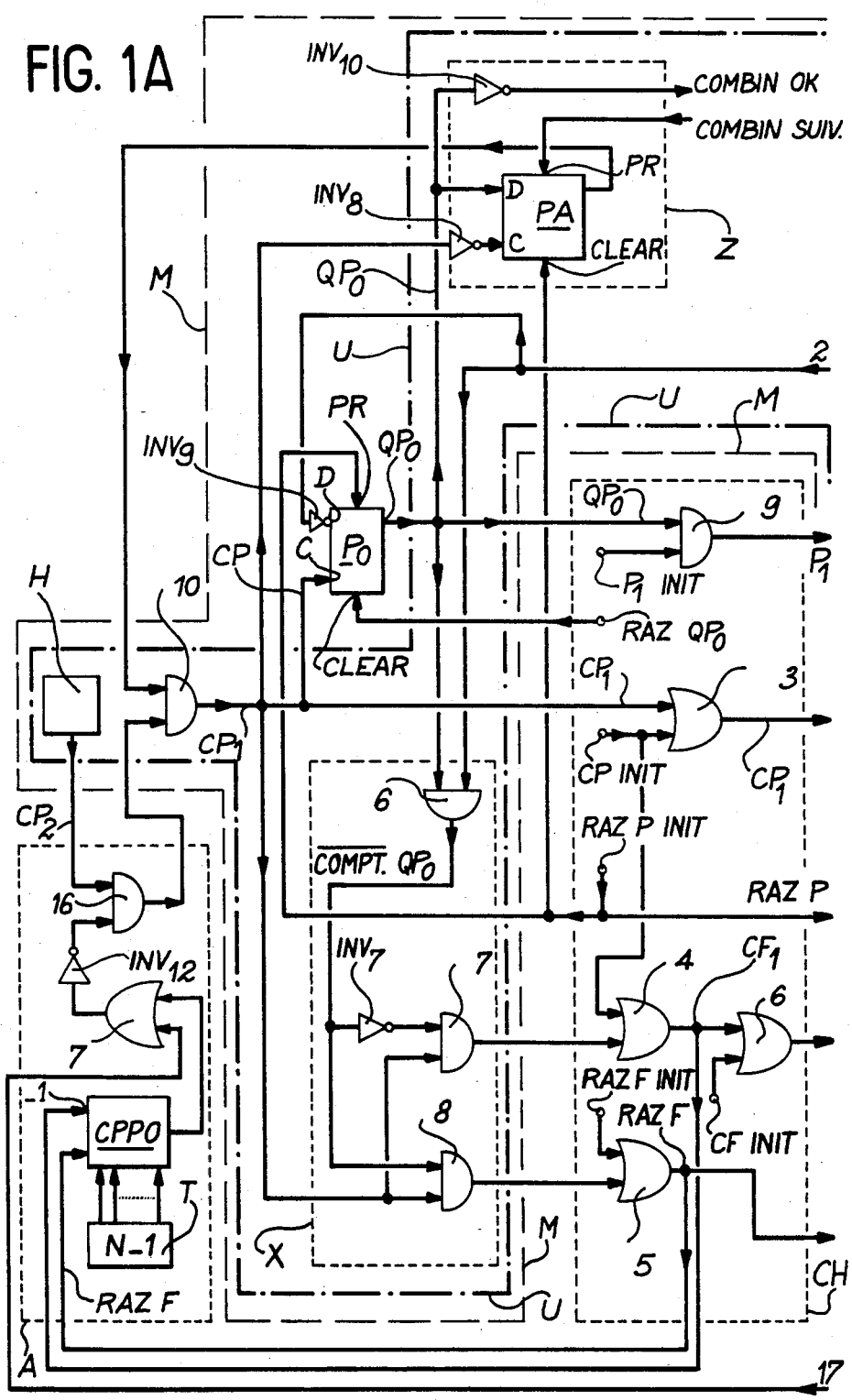
FIGS. 1A and 1B illustrate diagramatically the combination generator according to the invention.

Finally, it comprises control means M which, as will be seen hereinafter, when combined with counting means A enable shifts and transfers to be preformed between the flip-flops of the storage assembly P to ensure the presentation at the outputs of the flip-flops of the assembly P of all the combinations of signals which can be obtained, starting from such particular combination of signals.

As will be seen in greater detail hereinafter, the control means M allows the location of the storage means $P_i$ of the assembly P which provides a signal defined as being the means whose output is at the logic level 1 and which is immediately followed by the storage means $P_{i+1}$ whose output provides a signal at the logical level 0, the position i being as low as possible. The means M supply a succession of signals of logic level 1 to all the storage means eventually preceding the means $P_i$, starting with the storage means $P_1$ of position 1, up to the means $P_n$ of position n inclusive; n is equal to the number of logic levels 1 which exist on the storage means preceding the means $P_i$; this succession of logic levels 1 is if necessary completed by logic levels 0 after the storage means of position n and before the storage means of position i. The control means M also enable the logic state of the storage means $P_i$ to be replaced by a logic level 0, and the logic level of the storage means $P_{i+1}$ by a logic level 1. As will be seen, the repeated work of the control means M supplies all the combinations which follow the aforementioned particular combination.

The operation of the control means M, whose principle has just been explained in a very general manner herinbefore, will be better understood with reference to the table in FIG. 2 which gives the logical level of signals on the the outputs QP1, QP2, ... QP5 of the flip-flops P1, P2 ... P5 of the storage assembly P of the generator illustrated by way of example in FIG. 1.

Referring to the table in FIG. 2, it is supposed that at the start it is the three first outputs QP1, QP2, QP3 of the generator which provide signals of logic level 1, while the remaining outputs, QP4, QP5, provide signals of logic level 0. These logic levels are shown on the first line of the table in FIG. 2, The means M allow the location of the storage means $P_i$, which is defined as being a means whose output is at the logic level 1 and which is immediately followed by the storage means $P_{i+1}$ whose output is at the logic level 0, i being as low as possible. On the first line of the table in FIG. 2 the storage means $P_i$ is the flip-flop $P_3$ (i=3), while the storage means $P_{i+1}$ is the flip-flop $P_4$, since the flip-flop $P_3$, whose output QP3 provides a signal of level 1, is immediately followed by the flip-flop $P_4$, whose output QP4 provides a signal of a logic level 0. The position i is always as low as possible—i.e., the means M enable the first level transition 1, 0 to be detected at the outputs QP of the flip-flops of the assembly P. The means M enable a succession of signals of logic level 1, starting with the storage means $P_1$, up to the storage means of position n in clusive, n being equal to the number of levels 1 which exist at the storage means which precede the means $P_i$, to be brought onto all the storage means which precede the means $P_i$ ($P_3$ in the example in question); these outputs therefore do not change in logic state. The control means M also enable the level of the signal provided by the storage means $P_1$ to be replaced by a level 0 and the level of the signal provided of the storage means $P_{i+1}$ by a level 1. In the example illustrated in the table in FIG. 2, it can be seen at the second line of the table that the logic level 1 of the signal of the flip-flop $P_3$ has been replaced by a logic level 0, while the logic level 0 of the signal of flip-flop $P_4$ has been replaced by a logic level 1. All the signal provided by other flip-flops which follow the flip-flop $P_{i+1}$ (P5 in the example in question—second line of the table) do not change.

The second line of the table represents the second combination of signals provided by the three outputs (QP1, QP2, QP4) of the generator, which have a logic level 1, the two remaining outputs (QP3, QP5) provided signals of logic level 0. For this second combination i equal 2 and n equals 1.

Figure 1B:
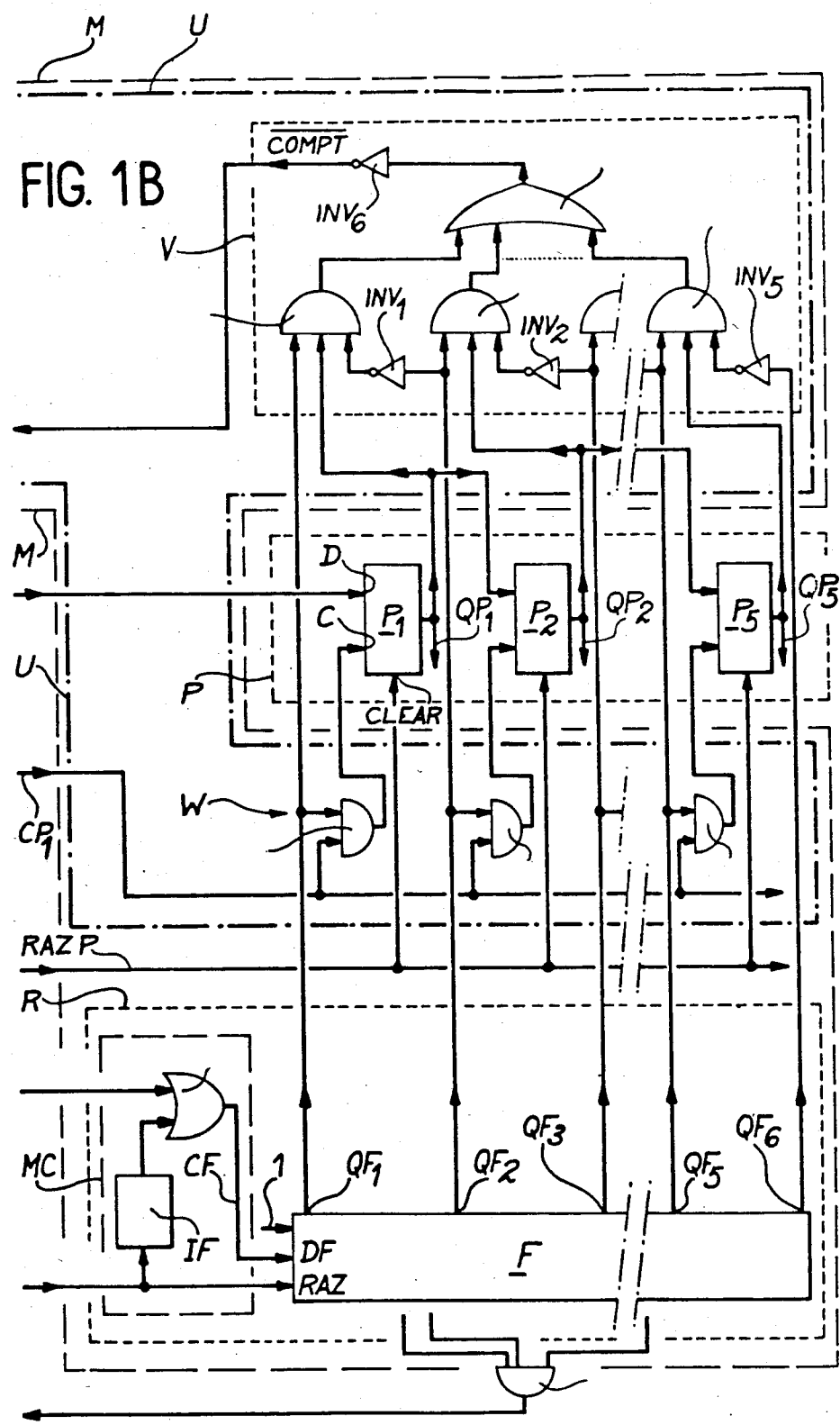

As stated hereinbefore, the means M enable the succession of signals of logic levels 1 which have been brought onto the flip-flops preceding the flip-flop $P_i$ to be completed by logic levels 0, if necessary brought onto all the flip-flops which follow the flip-flop of position n and precede the flip-flop of position i. Thus, for example, to pass from the fourth combination to the fifth combination of signals on the outputs of the generator (shown in the fourth and fifth lines of the table in FIG. 2), we start from i equals 4 and n equals 2 (fourth combination). The means M makes the signal of the flip-flop P5 changeover to the logic level 1, the flip-flop P4 providing the signal of logic level 0, returns logic levels 1 to the flip-flops which precede the flip-flop P4, except to the flip-flop P3, which is returned to the logic level 0, since it is the only flip-flop which is situated between the flip-flops of position i equals 4 and n equals 2. The fifth combination is then available at the generator outputs. The other combinations available at the outputs of the generator illustrated in FIG. 1 are shown on the various lines of the table in FIG. 2 and are obtained as disclosed hereinbefore.

It has been supposed in this table in FIG. 2 that the predetermined starting combination of signals is that which enables signals of level 1 to be obtained at the outputs of the first flip-flops (P1,P2,P3) of the storage assembly P, but clearly this first predetermined starting combination can be that which is shown on any of the lines of the table in FIG. 2

FIG. 3 illustrates in a more detailed manner the logic levels of the signals of the flip-flops of the storage assembly P of the generator, during the operations allowing the passage from one combination of signals to another.

The levels of the signals of the flip-flops shown in this table are those which allow passage from the first available combination to the second combination (passage from line 1 to line 2 in the table FIG. 2). Clearly, this table applies to the generator illustrated by way of example, which comprises N=5 outputs and which enables all the combinations of signals of logic level 1 to be obtained at p=3 of these outputs. The control means M which allows the location of the storage means $P_i$ and the performance of the operations described above on all the flip-flops preceding the flip-flop $P_i$ and also on the flip-flop $P_{i+1}$, comprises means R which is connected to the charging means of a particular combination, in the flip-flops of assembly P. The means R allows the location and reinitiation of the position t of the storage means of the assembly P which follows the first storage means whose output provides a signal of logic level 1 and also allows the evolution of the limit t of the location. The control means M also comprises storage means P0 whose output is QP0. The table also shows the logic level of signal at the output QP0 of the flip-flop P0 during the operation of the system, to pass from the first to the second combinations. In the example in question the means R allows at the first line of the table of the flip-flop P2, the location of the position t=2, whose output signal is at the logic level 1, because that flip-flop is the one which follows the first flip-flop P1 whose output QP1 provides a signal at the logic level 1. The location of the position t is shown by a dot in the table; the dot, which lies between the output of the flip-flop of position t and the output of the flip-flop of position t+1, indicates that the shifts no longer take place after the flip-flop of position t. Lastly, the means M comprise means U which cause a succession of one or more shift operations between the flip-flops P1 . . . PN of the assembly P via the agency of the location means R and the charging means CH. As will be seen hereinafter in greater detail, these shift operations are performed until the level of the signal at the output QP0 of the flip-flop P0 is the level 0. Each shift operation produces simultaneous shifts of the logic level of the signal of the flip-flop P0, in the direction of the storage means P1, and of each of the means $P_j$ of position j, in the direction of the following storage means $P_{j+1}$ of position j+1, for all the means $P_j$ whose position lies between 1 and t−1 so that the storage means Pk of position k do not change the logic of their output signals when the position k of such storage means is higher than t. The storage means P0 is charged by the output signal level of the storage means $P_t$ of position t, during such shift operation. Each shift operation therefore causes, as will be seen in greater detail hereinafter, either a reinitiation of the limit at t of location supplied by the means R, on condition that the output signal of the storage means $P_t$ is at the level 0 at the same time as the output level signal of the means P0 is the level 1, or an increase by one unit of the position t corresponding to the limit of the location of the means R, if the latter condition is not met. This evolution of the position t is conditioned by the level of the output signal of the means P0 and $P_t$ before shifting; the fresh position t becomes effective only after shifting. As will be seen hereinafter, the repeated application of the means U supplies the successive combinations of signals whose presence is determined by a signal of level 0 at the output of the flip-flop QP0.

As indicated in the first line of the table in FIG. 3, which gives the logic levels of the signals at the outputs of the flip-flops P0, P1 . . . P5, the location means R allowed the location of the position t=2 of the flip-flop P2, whose output QP2 is at the logic level 1, such flip-flop immediately following the first flip-flop P1 whose output QP1 is at the logic level 1. In the example in question, the flip-flop of the position t=2 being located, the storage means $P_j$ of position j are formed by the flip-flop P1, since the position j lies between 1 and t−1. It results from this that during the first shift operation which causes the flip-flops of the assembly P to pass from the logic levels shown on the first line of the table to those which are shown on the second line, the logic level 0 of the flip-flop P0 is transmitted to the flip-flop P1 the logic level of the flip-flop is transmitted to the flip-flop P2, and the levels of the flip-flops P3, P4, P5 pf position k higher than t=2 do not change. The storage means P0 are charged by a signal of the logic 1 of the flip-flop P2 of position t=2. Before this first shift operation the flip-flop P2 of position t=2 had at its output QP2 a logic level 1, while the flip-flop P0 also had at its output QP0 a logic level 0. In these conditions the means R allow the modification of the location limit t of the storage means of the assembly P, increasing the position of such limit by one unit. This is what is shown on the second line of the table, where the limit t is equal to 3. A fresh shift operation, comparable to that described hreinbefore, will be carried out up to that limit. As before, the logic level of the output signal of the flip-flop P0 is transmitted to the flip-flop P1; the logic level of the output signal of the flip-flop P1 is transmitted to the flip-flop P2 the logic level of the output signal of the flip-flop P2 is transmitted to the flip-flop P3, while the output signals of the flip-flops P4 and P5 retain their logic levels, since their position k is greater than t=3. In the same manner as before, during a fresh shift operation the logic level of the output signals of the flip-flop P3 of position t=3 is transmitted to the flip-flop P0. At the end of the shift operations the output signals of the various flip-flops are in the logic levels which are shown on the third line of the table. Here again it can be seen that before shifting output signal of the flip-flop P of position t=3 was at the logic level 1, while the output signal of the flip-flop P0 was at the logic level 1. In these conditions the means R increase by one unit the location limit t of the flip-flops of the assembly P, and it results from this that after the shift operations which have just been described, such limit t is equal to 4; it corresponds to output QP4 of the flip-flop P4. The shift operations described hereinbefore therefore start again in the same manner: the logic level of the output signal of flip-flop P0 is transmitted to the flip-flop P1, the output signal of the logic level of the flip-flop P1 is transmitted to the flip-flop P2, the logic level of the signal of the flip-flop P2 is transmitted to the flip-flop P3, the logic level of the output signal of flip-flop P3 is transmitted to the flip-flop P4. The output signal of the flip-flop P5 of position 5, greater than t=4 does not change its level. The logic level of the output signal of the flip-flop P4 of position t=4 is transmitted to the flip-flop P0, while the output signal of the flip-flop P5 of position higher than the limit t=4 does not change its level. On termination of the shift operations the output signal of the flip-flop P4 of position t=4 has a logic level 1, while the output signal of the flip-flop P0 has a logic level 0. The output signal of the flip-flop P0 having a logic level 0, it results that the logic levels shown on the fourth line of the table correspond to a combination of levels of signals available at the outputs QP1, QP2, ... QP5 of the generator.

Since the output signal of the flip-flop P4 of position t=4 had a logic level 0 before shifting, while the output signal of the flip-flop P0 had a logic level 1, the means R allow the reinitiation of the location position t, as was described for the first line of the table; when it is a question of a combination of levels of signals available at the outputs QP1, ... QP5 of the generator, the location limit t is fixed by the position of the flip-flop which immediately follows the first flip-flop whose logic output signal has a logic level 1. This flip-flop is the flip-flop P2 and the position t is therefore equal to 2.

It is from this location limit that the fresh shift operations must be carried out to search for the following combination of three outputs which provides signals at a logic level 1. In the case of the example which has just been described, fresh shift operations enable the combination shown on the third line of the table in FIG. 2 to be obtained.

The means R for location, reinitiation and evolution of position t are formed by a shift register F which comprises N+1 flip-flops numbered from 1 to N+1; the register is charged by t signals of logic level 1 on the t first flip-flops and N−t+1 signals of logic level 0 on the following flip-flops; the N+1 signals of the outputs (QF1, QF2, ... QFN+1) serve to validate or not, the shifts between the flip-flops of the storage assembly P and to select the flip-flop $P_t$ by detecting the level transition 1, 0 on the register F, to move the logic level of the output signal of the flip-flop $P_t$ in the direction of the means P0. QF1 validates the transfer between P0 and P1, QF2 validates the transfer between P1 and P2 ... QFN validates the transfer between the flip-flops PN−1 and PN. The flip-flop QFN+1 allows the detection of the level transition 1, 0, whatever the value of N. As was seen hereinbefore, on the reinitiation of the generator, when the latter has the first available combination (t=2), the two first flip-flops of the shift register F have signals at their outputs QF1 and QF2, at logic levels 1, while the signals on the other outputs QF3 ... QF6, have a logic level 0. The evolution of the shift register F is performed via the agency of a control module MC which comprises an OR1-gate one input of which receives shift control pulses CF1 coming from means which will be disclosed in greater detail hereinafter; another input of the OR1-gate is connected to a reinitiation circuit IF which allows, on the reinitiation of the register F by a signal RAZF, the application to the shift register of two pulses CF at its shift control input DF. This circuit is conventionally constructed so that when it receives a pulse at the input it supplies two pulses delayed in relation to the first pulse at its output. One control input of the register is permanently taken to the logic level 1, so as to propagate a signal of this logic level to the various flip-flops on each of the pulses CF. The shifts between the flip-flops P1 ... P5 of the storage assembly P are controlled by pulses CP coming from means which will be described in detail hereinafter; these pulses are applied to one of the inputs of the AND-gates ET1, ET2 ... ET5 belonging to shift operation control means W; the other inputs of these gates are connected respectively to the outputs QF1, QF2 ... QF5 of the shift register F. The outputs of each of these gates are connected respectively to the shift control inputs C of the flip-flops P1 ... P5 of the assembly P. These gates, in association with the register F, allow simultaneous shifts of the logic level of the output signal of the flip-flop P0 in the direction of flip-flop P1 and of each of the flip-flops $P_j$ in the direction of the flip-flops $P_{j+1}$ for all the flip-flops $P_j$ whose position lies between 1 and t−1, the output signal of the flip-flops of position k>t not changing their level and the flip-flop P0 being charged by the logic level of the signal of the flip-flop $P_t$ of position t, as defined previously in the explanation of the table in FIG. 3.

The means U which calls a succession of shift operations between the N flip-flops of the storage assembly P also comprise a means V which enables the level of the output signal of the flip-flop $P_t$ to be moved in the direction of the input D of the flip-flop P0. This flip-flop, like the flip-flops of the assembly P, is a flip-flop of type D whose input D is an input which determines the level of the input signal. This level is stored by the application of a clock signal CP to the input C of the flip-flop. The memorized state of the flip-flop is available at the output QP0 thereof. This flip-flop has two extra inputs. The input PR which enables the flip-flop to be put into the level 1 by applying a signal of a level 0 to such input, and the CLEAR input which enables this flip-flop to be put into the level 0 by applying a 0 signal level to such input. In normal operation the clear and PR inputs are at the level 1. This flip-flop can, for example, be that of the type SN 54-74L74 marketed by the TEXAS INSTRUMENTS Company. The means V which enables the level of the signal from the flip-flop $P_t$ to be moved towards the input of the flip-flop $P_o$ comprises the AND-gates ET11, ET12 ... ET15. The gates are provided to the same number as the number of flip-flops of the assembly P and each of them, in a first embodiment of the generator according to the invention, has an input which is connected to the output $Q_{Pb}$ of the corresponding flip-flop $P_b$ of the assembly P. The other inputs of each of these gates are respectively connected to the output $Q_{Fb}$ of the same position b of the flip-flop $F_b$ of the register F and to the output $Q_{Fb+1}$ the flip-flop $F_{b+1}$ of immediately higher position. Thus, for instance, as regards the AND-gate $ET_{11}$, one of its inputs is connected to the output QP1 of the flip-flop P1, while the two other inputs of such gate are connected respectively to the outputs QF1 and QF2 of the flip-flops of the register F. The output $Q_{Fb+1}$ of the register F is also connected to the input of the corresponding gate via the agency of an inverting amplifier. The inverting amplifiers used in the means V have the references INV1, INV2 ... INV5 in the drawing.

In another embodiment of the generator according to the invention the AND-gates of the means V which enable the logic level of the flip-flop $P_t$ to be moved in the direction of the input of the flip-flop P0 are gates with four inputs. The gates are to the same number as the number of flip-flops of the storage assembly P. For a gate which corresponds, for instance, to the flip-flop $P_b$ the inputs of the gate are connected as follows: one of the inputs is connected to the output $Q_{pb}$ of the flip-flop $P_b$, while the other input is connected to the output $Q_{Fb}$ of the register F; the two other inputs are connected respectively to the inputs $Q_{Pb-1}$ and $Q_{Pb-2}$ of the flip-flops $P_b$ and $P_{b-2}$ of the storage assembly. The output $Q_{Pb-2}$ is connected to the input of the corresponding AND-gate via the agency of an inverting amplifier.

In the first embodiment of the means V which enabled the logic level of the signal from the flip-flop $P_b$ to be moved in the direction of the input of the flip-flop P0, the logic level of the output of the flip-flop $P_t$ is carried towards the input of the flip-flop P0 only if the corresponding output $Q_{Fb}$ of the register F is at the level 1 and if the output $Q_{Pb+1}$ of directly higher position is at the level 0. Thus, for example, in the table in FIG. 3 (lines 1 and 2 of the table) the output level of the flip-flop P2 of position t=2 is carried towards the input of the flip-flop P1 if the output QF2 of the register F is at the level 1, and if the output QF3 of such register is at the level 0.

In the same embodiment of the means V which enable the logic level of the signal of flip-flop $P_t$ to be carried in the direction of the input of the flip-flop P0, this is done only if $QP_b=1$, $QF_b-1$. $QF_{b-1}=1$, and $QP_{b-2}=0$. The means V also comprise an OR2-gate which supplies a COMPT signal. The signal is converted by an inverting amplifier INV6 into a $\overline{COMPT}$ signal; this signal corresponds to the logic level of the signal of the output of the flip-flop $P_t$, which has been detected by the transition of level 1, 0 at the output of the register F, as stated hereinbefore. The means U which cause the successions of shift operations between the flip-flops of the storage assembly P also comprise means W which will be described in detail hereinafter and which enable the shift operations to be controlled between the flip-flops of the assembly P, inter alia via the agency of the flip-flop P0. The control means W are connected to the means V for moving the logic level of the signal at the output of the flip-flop $P_t$; they are also connected to the control inputs C of the flip-flops of the storage assembly P and to the outputs QF1, ... QF5 of the shift register F. The means U also comprise a control means X which is connected on the one hand to shift operations control means W and on the other hand to the output QP0 of the flip-flop P0; the means X allow either the reinitiation of the location limit t of the locating and reinitiation means R, or the increase of the position of such limit t by one unit. The means X comprises the AND-gates ET6, ET7 and ET8 and also the inverter INV7. The AND-gate 6 produces the signal COMP.QP0; the inverter INV7 and also the AND-gates 7 and 8 form two synchronisation circuits, as will be shown in greater detail hereinafter. An inverter INV9 receives the $\overline{COMPT}$ signal and its output is connected to the input D of the flip-flop P0. The control means X allow the management via the agency of the charging means CH and the shift register F, of the simultaneous shifts of the logic level of the output signal of the flip-flop P0 in the direction of the flip-flop P1 and each of the logic level of the output signal of the means $P_j$ in the direction of the means $P_{j+1}$ for all the means $P_j$ whose position lies between 1 and t−1. The output signals of the means $P_k$ do not change their level for all the flip-flops $P_k$ of position higher than t. The storage means P0 are charged by the logic level of the output signal of the means $P_t$ of position t during such shift operation. As will be shown in greater detail hereinafter, the control means X for the locating means R can allow the control of shifts between the flip-flops of the register F via the agency of the charging means CH, so that the flip-flops of the storage assembly P have output logic level signals corresponding to a predetermined combination. The means CH comprise an AND-gate 9 whose input is connected to the output QP0 of the flip-flop P0, one of its other inputs receiving a signal P1 INIT in the case of a predetermined combination of signals being charged into the flip-flops of the assembly P. The charging means CH comprise also OR-gates 3,4,5,6. As will be shown in greater details hereinafter, the OR-gate 3 receives pulses $CP_1$ coming from a clock H and receives a signal CPINIT on reinitiation. This gate controls the charging of the flip-flops of the assembly P on reinitiation; it also enters into the control of various shift operations. Its output supplies the clock signal CP to one of the inputs of the AND-gates 1 ... 5. The OR-gate 4 controls the shift operations in the register F. It receives on the one hand the signal CPINIT and on the other hand the output signal of the AND-gate 7 which itself receives the signals CP and $\overline{COMPT}$ QP0. The OR-gate 4 supplies the signals $CF_1$ which controls the shift operations in the register F via the control module MC. As will be seen hereinbelow, the gate also controls the clock H via the means A. The OR-gate 5 is a gate which receives on the one hand a signal RAZFINIT and on the other hand a signal coming from the output of the AND-date 8. This gate delivers a signal RAZF which permits the zero presetting of the register F on its RAZ input. Finally the OR-gate 6, one of whose inputs is connected to the output of the OR-gate 4, the other input being able to receive a signal CFINIT allows, when the generator is required to start at any combination, the control of the shifts in the register F so as to control the appearance of that combination of logic signals at the required outputs of the flip-flops of the storage assembly P. Inter alia it enables the position t to be fixed.

The means U which cause the succession of shift operations between the flip-flops of the storage assembly P, also comprise means Z which in this case, are formed by a flip-flop PA of type D; this flip-flop allows the indication of whether a combination is present at the outputs of the flip-flops of the storage assembly P, and also allows the control of the start of search operations for some other combinations. When a combination is present at the outputs of the flip-flop of the storage assembly P, a signal COMBINOK is supplied to the outputs of an inverter INV10; this signal is in fact the signal QP0, a signal QP0 being applied on the one hand to the input of the inverter INV10 and on the other to the input D of the flip-flop PA. The input C of the flip-flop receives via the inverter INV 8 the pulses CP of the clock H. The output of this flip-flop is connected to the input of an AND-gate 10, another input of which receives the clock pulses CP via counting means A which will be disclosed in detail hereinafter. The input PR of the flip-flop PA receives a control signal "COMBIN SUIV" when the following combination of signals is to be looked for, after a combination which has just been displayed. Finally, the CLEAR input of the flip-flop PA receives the signal RAZPINIT on the reinitiation of the device. The flip-flop PA inter alia permits the location of the presence of a signal of a logic level 0 at the output QP0 of the flip-flop P0, so as to stop the clock H via the counting means A.

The counting means A which enable the generation of the combinations to be stopped, comprise a counter CPP0 which is charged by a register T with the value $N-1$ on each reinitiation of the position t. Such charging is controlled by the signal RAZF which is applied when the register F is reinitiated to the counter CPP0. This counter comprises another input which enables its contents to be described by one unit on each increase of the position t in the register F. This input bears the reference—1 on the drawing and is connected to the output of the OR-gate 4. The shift operations are stopped when the contents of the counter CPP0 is equal to 0; such stoppage is controlled by the output signal of the counter applied to an inverter INV12; the output of the inverter is connected to one of the inputs of an AND-gate 16 whose other input receives the pulses $CP_2$ of the clock H. The output of this gate is connected to one of the inputs of the AND-gate 10, whose other input is connected to the output of the flip-flop PA. When the contents of the counter are equal to 0, its output signal passes to the level 1 and so blocks the AND-gate 16 as to stop the shift operations controlled by the clock pulse $CP_1$, which act on the control means X and the charging means CH. On the reinitiation of the device, the flip-flop P0 is zero reset via the signal RAZQP0 applied to the CLEAR input of that flip-flop.

The module MC enables two pulses CF to be generated on reinitiation. The two pulses are situated between two clock pulses $CP_1$, so as to measure a correct functioning of the generator. The AND-gate 10 which follows the clock H is in fact a synchronising circuit which only passes the clock pulse if it is complete. This avoids letting clock pulses pass if a signal COMBINOK validating the start of the shift operations occurs during a clock pulse $CP_1$, since this portion of a pulse may act incorrectly. The particular AND-gates 10 and 16 can, for example, each be obtained from a synchronising circuit of type 74 120 marketed by the TEXAS INSTRUMENTS Company. The synchroniser represented by the AND-gate 10 lets complete pulses pass only if the validation signal is at level 1 at the moment of the 0, 1 level transition of the clock pulse.

The principle of operation of the generator which has just been described is as follows: if we consider that $N=5$ and $p=3$, the first combination available at the outputs of the flip-flops of the storage assembly P is the combination 1 1 1 0 0. The signal of the output QP3 of the flip-flop P3 is at the level 1, and only one combination of two signals of level 1 exists on the preceding flip-flops. The following combinations are worked out with QP4 output level=1 by sweeping all the possibilities offered at the outputs of the flip-flops of lower position which combine two signals of level 1. There are three possibilities; consequently three combinations are therefore supplied at the outputs of the flip-flops QP1, QP2, QP3 when QP4 output level signal=1. All the combinations available on the flip-flops of lower position than 4 being supplied, the signal of the output QP5 of the flip-flop P5 is then at the logic level 1, and the same process starts again with $p=2$ on the four first flip-flops, which thus supply $1+2+3=6$ combinations. Consequently, a total of ten combinations of signals are supplied at the outputs of the generator when $N=5$ and $p=3$. Every time that, starting from position 1, there exist levels 1 on successive flip-flops from the position q to the position r (with $1<q<r$) and levels 0 on all the flip-flops from position 1 through to position $q-1$ (if $q-1>1$), this corresponding to the fact that, the output signal of the flip-flop of position r being at a level 1, all the sweeping possibilities of possible combinations of the $r-1$ first flip-flops have been reviewed. Passage to the following combination then causes a setting to logic level 1 of the flip-flop of position $r+1$, a setting to logic level 0 of the flip-flop r and a reinitiation bringing all the successive levels 1 which precede the flip-flop of position r onto the successive flip-flops, starting from position 1. This then enables all the combinations to be swept for the r first flip-flops, starting again from the beginning. The flip-flop P0 whose output QP0 enables level 0 or level 1 to be brought to the input of the flip-flops of the assembly P, by the looping of the flip-flop $P_l$, acts as follows: the flip-flop $P_l$ selected for the re-looping corresponds to the flip-flop which allows the first flip-flop which is at level 1 in the sequence of level 1, during the course of treatment; in this way, during successive shifts, if this first level 1 is followed by a logic level 1 of the following flip-flop, this level 1 is brought back to the flip-flop P0 and the level 0 of the flip-flop P0 contained therein at the start, is shifted by one notch, while the position t increases by one unit. This operation is repeated until this first level is followed by a level 0, until the moment when the flip-flop of position immediately higher than p is reached by this level 1; at that moment the output QP0 of the flip-flop P0 presents a logic level 0, and this triggers the appearance of the combination display signal COMBINOK at the output of the flip-flop PA. If necessary, in one variant, the position t might be placed to correspond to the position of the first flip-flop of level 0 following a flip-flop at level 1, shifts being performed as far as the position t by relooping the flip-flop $P_t$ on the flip-flop P1 until the level of flip-flop $P_{t-1}$ is equal to 0. In that case the flip-flop P0 would be eliminated and replaced by a means allowing a search for the positioning of $P_t$ and also by a means for reading out the contents of the flip-flop $P_{t-1}$.

Figure 5:
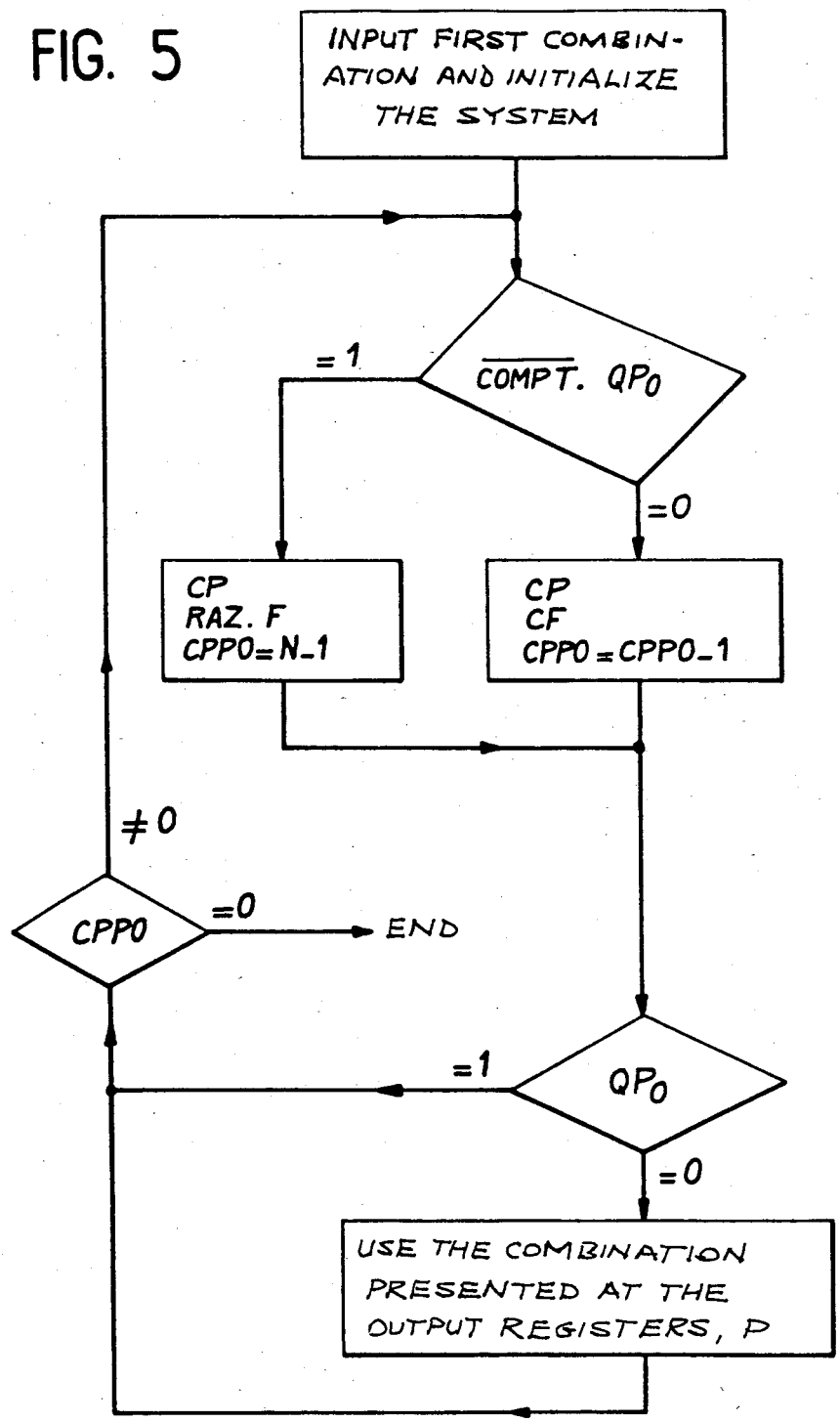
FIG. 5 is an flow chart which enables the operation of the generator according to the invention to be more clearly understood.

The table in FIG. 4 and also the organigram in FIG. 5 will now enable the operation of the generator to be understood more clearly.

The table in FIG. 4 shows the logic levels of the signals at the outputs QP0, QP1, . . . QP5 of the flip-flops P1 to P5 of the generator illustrated in FIG. 1. The value of the contents of the counter CPP0 is also shown. The first column of the table represents the main signals which occur during the operation of the generator. The table is subdivided into areas A,B.C . . . J.K, which represent the output signal levels of the various flip-flops of the storage assembly P and also the contents of the counter CPP0 during the various shift operations which enable a passage to be made from one combination to another. The last line of each area represents the combination of logic signals at a level 1 which are available at the outputs of the generator. As shown by the organigram in FIG. 5, the first operation consists in introducing the first combination into the flip-flops of the storage assembly P. It also consists in reinitiating the system. To charge this first combination, a pulse RAZPINIT zero resets the flip-flop PA which blocks the clock pulses CP via the synchronising AND-gate 10. This pulse also arrives at the input PP of the flip-flop P0 whose output QP0 passes to level 1; the result is that at the output of the inverter INV 10 the signal COMBINOK is absent, indicating that at present there is no combination at the outputs of the register P. The RAZPINIT pulse also permits the zero resetting of all the flip-flops P (P1 to P5), this being shown on the first line of FIG. 5. The following signal is the signal FAZFINIT. This signal zero resets all the flip-flops of the register F and triggers the circuit IF of the control module MC to reinitiate at the logic level 1 the signals on the outputs QF1 and QF2 of the register F, all the other outputs (QF3 . . . QF6) being at zero. The counter CPP0 is charged with the value N−1 (4 in the example in question). Consequently, following this operation t=2; the main object of the operation is to validate the shifts of logic level 1 signals emitted from P0 towards the flip-flops of the register P. The position of the point shows this validation as far as the flip-flop P2 on the second line in FIG. 1. Then p pulses (i.e. 3 in this example) are emitted on CPINIT so that signals of level 1 are propagated as far as the flip-flop P3 of the assembly P. Each pulse CPINIT acts via the OR-gate 3 to cause a shift of the register P and via the OR-gate 4 to cause a shift of the register F, so as to authorise the continuance of the transmission of the 1 levels.

These reinitiation operations of the register F and the flip-flops of the assembly P are located by the signal CPINIT in the table in FIG. 4. After these operations the counter CPP0 is charged and contains the value N−1−p=5−1−3=1. The above operations, triggered by the pulses RAZFINIT and CPINIT, do not for the moment produce any result, since the clock is blocked by the AND-gate 10. In the example in question, p=3 pulses CPINIT have been applied to the OR-gate 3 so as to charge signals of logic levels 1 into the three first flip-flops of the assembly P. Each pulse CPINIT produces a shift in the signal levels of the flip-flops of the assembly P; the pulse CPINIT also produces a shift in the signal levels of the flip-flops of the register F, which are thus charged with logic levels 1 which simultaneously produce the progress of the authorizations of shifts between the flip-flops of the assembly P. The pulse RAZFINIT applied to the OR-gate 5 allows the zero resetting of the register F due to the output signal RAZF of that gate. The signal RAZFINIT also triggers the circuit IF which allows the control of the sending of two pulses CF to the register F at its shift input DF, so as to reinitiate this register at t=2 (a value corresponding to the display of the first combination). This pulse RAZFINIT also allows the charging of the counter CPP0 with the value N−1. Finally, a pulse RAZQP0 is applied to the CLEAR input of the gate P0. This pulse zero resets the signal of the output QP0 of the flip-flop P0; the zero resetting of this output signal allows, via the inverter INV10, the indication by means of a logic level 1 corresponding to the signal COMBINOK present at that output, that a combination of logic signals of level 1 is available at the outputs QP1 . . . QP5 of the generator. The various operations which have just been described are those indicated in Area A of the table in FIG. 4. From that moment onwards the successive following combinations can be sought.

To this end a pulse COMBIN SUIVANTE coming from outside the generator brings to a logic level 1 the flip-flop PA which allows the validation of the clock pulses due to the synchronising AND-gate 10.

If each combination of signals is to be presented for a certain time, it is possible to use a first conduction period monostable flip-flop (not shown) triggered by the levels transition 0,1 of the signal COMBINOK; this monostable flip-flop is connected to a second monostable flip-flop which delivers a fine pulse at the end of the conduction period of the first monostable flip-flop; this fine pulse is applied to the input COMBIN SUIVANTE of the flip-flop PA.

The rising fronts of the clock pulses $CP_1$ which are transmitted by the synchronising AND-gate 10 allow the transfers of logic levels as signals from the flip-flop $P_t$ to the flip-flop P0 and the shifts of P0 towards P1 and of the flip-flops Pi towards the flip-flops Pi+1, when the output signals of the register F validate such shifts. The descending front of the clock pulses $CP_1$ transmits the level of the signal of the output QP0 of the flip-flop P0 to the flip-flop PA; the latter acts on the AND-gate 10 so as to block the clock if QP0=0 (PA being at the level 0) or to allow the clock pulses to be transmitted if the output signal of the flip-flop PA is at the level 1 (QP0 being at the level 1).

The flip-flop PA acts as an interface between the combination generator and the user. Thus, the user knows that a combination of signals is available when the signals of the output COMBINOK of the flip-flop PA is at the logic level 1. This combination is used, for example, to inject failures on a simulator (to make a dependability study, for example); when the simulator has given its reply, the user sends a signal "COMBIN SUIV" so as to bring the flip-flop PA to a level 1, to obtain the restarting of the clock and a search for the following combination. The signal at the output of the flip-flop PA changes of logic level after the flip-flop P0 on the descending front of the pulse CP of the clock H, so as to give the flip-flop P0 the time to reach its output signal level. The clock pulses must be adequately separated to give the flip-flop PA the time to block the clock in cases in which QP0=0. The pulse COMBIN SUIV not being synchronised with the clock, the flip-flop PA enables that pulse to be stored until the clock is activated again.

The following state shown in the organigram in FIG. 5 consists in testing the value $\overline{COMPT}$ QP0. This value is equal to 1 only when the output signal of $P_t=0$ and the output signal of QP0=1—i.e., when after the following clock pulse $CP_1$ the fresh combination can be displayed, since the output signal of OP0 will be equal to 0. In that case the clock pulse $CP_1$ is validated by the synchronising AND-gate 10 and the signal RAZF is delivered by the AND-gate 8. This signal, which reinitiates the register F, also allows the triggering of the charging of the counter CPP0 with the value N−1. If, on the other hand, the value $\overline{COMPT}$ QP0 is equal to 0, the clock pulse passes through the AND-gate 10 and allows the application of a pulse CF to the register F via the AND-gate 7 and the OR-gate 4; this pulse CF also permits the reduction by one unit of the contents of CPP0. This operation is shown by CPP0=CPP0−1 in the organigram in FIG. 5. The following stage consists in testing the logic level of the signal at the output QP0 of the flip-flop P0. If QP0=0 this means that the combination of signals is present at the outputs of the storage assembly P. This combination can be used and the following combination can then be sought by carrying out a certain number of shift operations whose number is fixed by the contents of the counter CPP0, except if the counter CPP0 has reached the value 0. If the contents of CPP0 is equal to 0, this means that all the available combinations of signals have been swept; if on the other hand, the contents of the counter CPP0 is different from 0, this means that the following combination can be sought, starting from the combination which has just been available. If the signal at the output QP0 of the flip-flop P0 is at the logic level 1, no combination of signals is available at the outputs of the flip-flops of the assembly P, the shift operations continue as indicated above, until the output signal of P0 is at the logic level 0, in which case a fresh combination is available, or until the contents of CPP0 is equal to 0, in which case the search for combinations is terminated.

The counter CPP0 is charged at each pulse RAZF by the register T which contains the value N−1. Instead of using a register containing the number N−1, it is possible to use a system of encoding wheels which display this number on the front face of the generator or of any other equivalent system. When the counter reaches the value 0, its output signal passes to the logic level 1, and this stops the propagation of the clock pulses $CP_2$ and blocks the search for combinations. When the contents of the counter is different from 0, its output signal is at the logic level 0.

In the operation of the generator which has just been described, it was supposed that all the combinations were displayed following the initial combination signals, visible whose levels are on the first line of the table in FIG. 2. It is also possible to display all the combinations starting from a predetermined combination. In that case the AND-gate 9 or the OR-gate 6 serve to charge on the one hand the flip-flops of the storage assembly P and on the other hand the register F by the signals of logic levels corresponding respectively to the combination selected, and to the value of p which fixes the position of the flip-flop which immediately follows the first flip-flop having its output at the logic level 1 in the sequence selected. The register P is charged as follows: a pulse RAZPINIT enables the register P to be zero reset and the output of the flip-flop P0 to be brought to the logic level 1. A pulse RAZFINIT if applied to reinitiate the register F so that t=2 and to authorise the shifts of the logic levels between the flip-flops of the registers P. Pulses CPINIT are applied to the OR-gate 3, while the AND-gate 9, one input of which is connected to the output QP0 of the flip-flop P0 receives at its input $P_1$ INIT successive signals of levels 1 or 0 corresponding to the required starting combination. These logic levels sent to the input P1 INIT are of course combined with the pulses CPINIT so as to obtain at the outputs of the flip-flops of the storage assembly P the required combination of logic level 1. The flip-flops of the assembly being positioned, the register F must then be positioned at the known value of t during reinitiation, because of the knowledge of the injected combination, which fixes the position of the flip-flop of the storage assembly which immediately follows the first flip-flop at a level 1 in the sequence selected. To position the register F at the value t, a pulse RAZFINIT is applied to the register F to produce its reinitiation at t=2 and pulses CFINIT are then applied to the input of the OR-gate 6 in a number equal to t−2.

Figure 6:
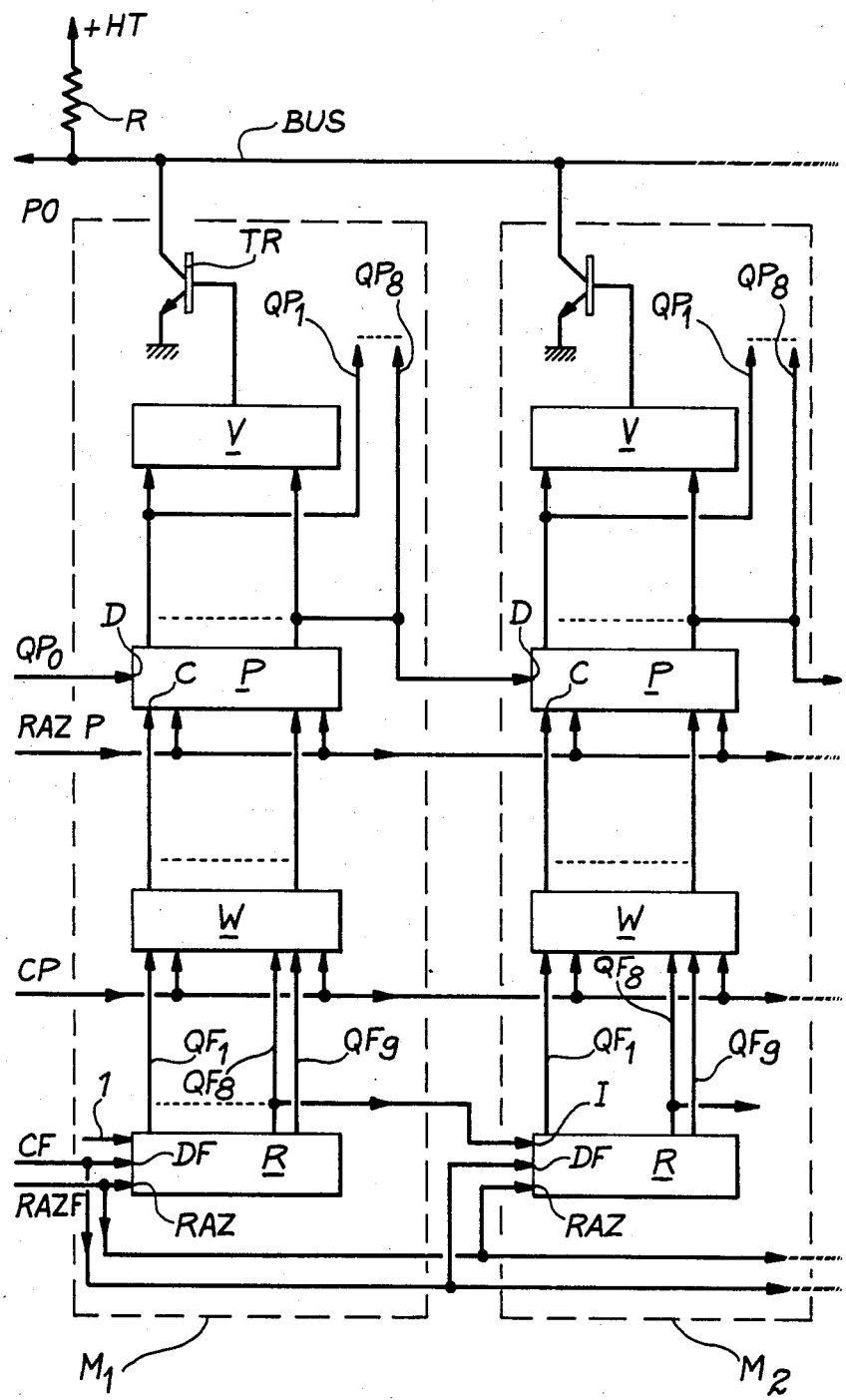
FIG. 6 illustrates the generator according to the invention diagramatically in its modular construction.

FIG. 6 illustrates diagrammatically the generator according to the invention in the case in which it is constructed in modular form. In this embodiment the flip-flops of the assembly P, the means V for moving the logic level of the signal of the flip-flop $P_t$ in the direction of the flip-flop P0 form a module. The generator comprises a plurality of such modules connected in cascades, so that the output of the last flip-flop of a storage assembly P of a module is connected to the input of the first flip-flop of the storage assembly P of the following module. The output of the last flip-flop of the locating means R of a module is also connected to the input of the first flip-flop of the locating means of the following module. Each output of the OR-gates of the means V for moving the output logic level of the flip-flop $P_t$ towards the input of the flip-flop P0 is connected to the input D of the flip-flop P0 by a transistor mounted as an "Open Collector". The output QP0 of the flip-flop P0 is connected to the input of the first flip-flop of the storage assembly P of the first module. The flip-flops of the storage means of the assemblies D of the modules, and the flip-flops of the locating means R for reinitiating the modules are connected to the charging means CH. FIG. 6 shows only two of the modules M1 and M2, and it is supposed that each of them contains storage assembly P formed by eight flip-flops whose outputs are shown as QP1 . . . QP8. In each module the corresponding means R for locating and reinitiating the position t comprise in this embodiment 9 flip-flops whose outputs are shown as QF1 . . . QF9; finally each module also comprises the corresponding means V for moving the logic level of the flip-flop $P_t$ of that module towards the flip-flop P0 (not shown in this figure). Lastly, each module comprises the shift control means W. These means comprise inter alia in the example described and for each module eight AND-gates (now shown) whose outputs are connected to the inputs C of the flip-flops of the storage assembly P of each module. The second module M2 is formed in the same way and will not be described in detail. The first flip-flop of the storage assembly P of the first module receives at its input D a signal QP0 coming from the gate P0, while the last output QP8 of the last flip-flop of the assembly P of the first module is connected to the input D of the first flip-flop of the assembly P of the second module. The successive following modules are interconnected in the same way. All the flip-flops of the storage means P of the successive modules receive the signal RAZP. The means W for controlling the shift operations between the flip-flops of each storage assembly P receive the clock pulses CP. Lastly, the flip-flops F of the locating means R receive the shift pulses CF and also the zero resetting pulses RAZF. This figure does not show the other means associated with the generator according to the invention which emit the signals mentioned hereinbefore; these means have been disclosed previously and are common to all the modules. The means V which supply the signal COMPT which enables the logic level of the flip-flop $P_i$ to be moved towards the flip-flop P0 are connected thereto via a common BUS line. The means V of each module are connected to that line via a transistor TR mounted as an open collector or by means of an equivalent circuit. This NPN transistor has its base which is connected for example to the output of the means V (it replaces the inverter INV 6 in FIG. 1, for example). The emitter of the transistor is connected to earth M; its collector is connected to the BUS line and to a positive voltage source +HT via a resistor R common to all the transistors mounted as open collectors at the output of each of the modules. Clearly, this transistor mounted as an open collector which is shown in this case at the output of the means V might be included in the inverter 6 in FIG. 1, for example. The output QF8 of the locating means R of the module is connected to the input I of the first flip-flop of the following means R; this input I corresponds to the input which, in the first flip-flop of the register F of the first module, is taken to the logic level 1. Thus, the last flip-flop of a storage assembly P of a module transmits its logic level to the first flip-flop of the storage assembly P of the following module; the last flip-flop but one of the register F of the locating means R of a module transmits its logic level to the first flip-flop of the register F of the locating means R of the following module. This type of modular assembly has the advantage of reducing the number of control connections when the number of flip-flops becomes considerable; lastly, the transistors taking the form of "open collectors" which connect the outputs of the locating means V of the flip-flops $P_i$ allow the transmission to the flip-flop P0 of the signal $\overline{COMPT}$ coming from one of the modules without causing a short circuit on the similar outputs of the other modules. The transistor in fact behaves like a switch which closes only when a signal $\overline{COMPT}$ is available at the output of a module. Clearly, the generator described is not limited to the number of outputs given by way of example.

A variant (not shown) consists in using only 8 flip-flops QF1 . . . QF8 for the register F and in adding a connection coming from the output QF1 of the module M2 in the direction of the module M1 to replace the signal of QF9. In the preceding variant the output signal of the flip-flop QF 9 was at the same logic level as the flip-flop QF1 of the following module. The advantage resides in the suppression of a link between the modules.

The generator just described can also comprise a logic blocking circuit formed, for example, by an AND-gate 17 and an OR-gate 7. This logic circuit allows the blocking of the generation of combinations of signals from a predetermined combination onwards. For this purpose the inputs of the AND-gate 17 are respectively connected, by connections not shown in the figure, to outputs of the storage means P which correspond to the outputs which supply such predetermined combination.

Thus, for example, in the embodiment described, the generator enables combinations of signals of logic level 1 to be effected at three outputs; the AND-gate 17 has three inputs which are respectively connected to the three outputs of the storage means P which correspond to a predetermined combination beyond which it is desired to stop the generator. The output of the AND-gate 17 is connected to an input of the OR-gate 7, one other input of which is connected to the output of the counter CPP0 of the stoppage means A. When the three input signal of the AND-gate 17 are at a logic level 1, the output signal of the AND-gate 17 is at a logic level 1, and the OR-gate 7 whose output signal is at the logic level 1 blocks the AND-gate 16 and therefore blocks the clock H.

Figure 7A:
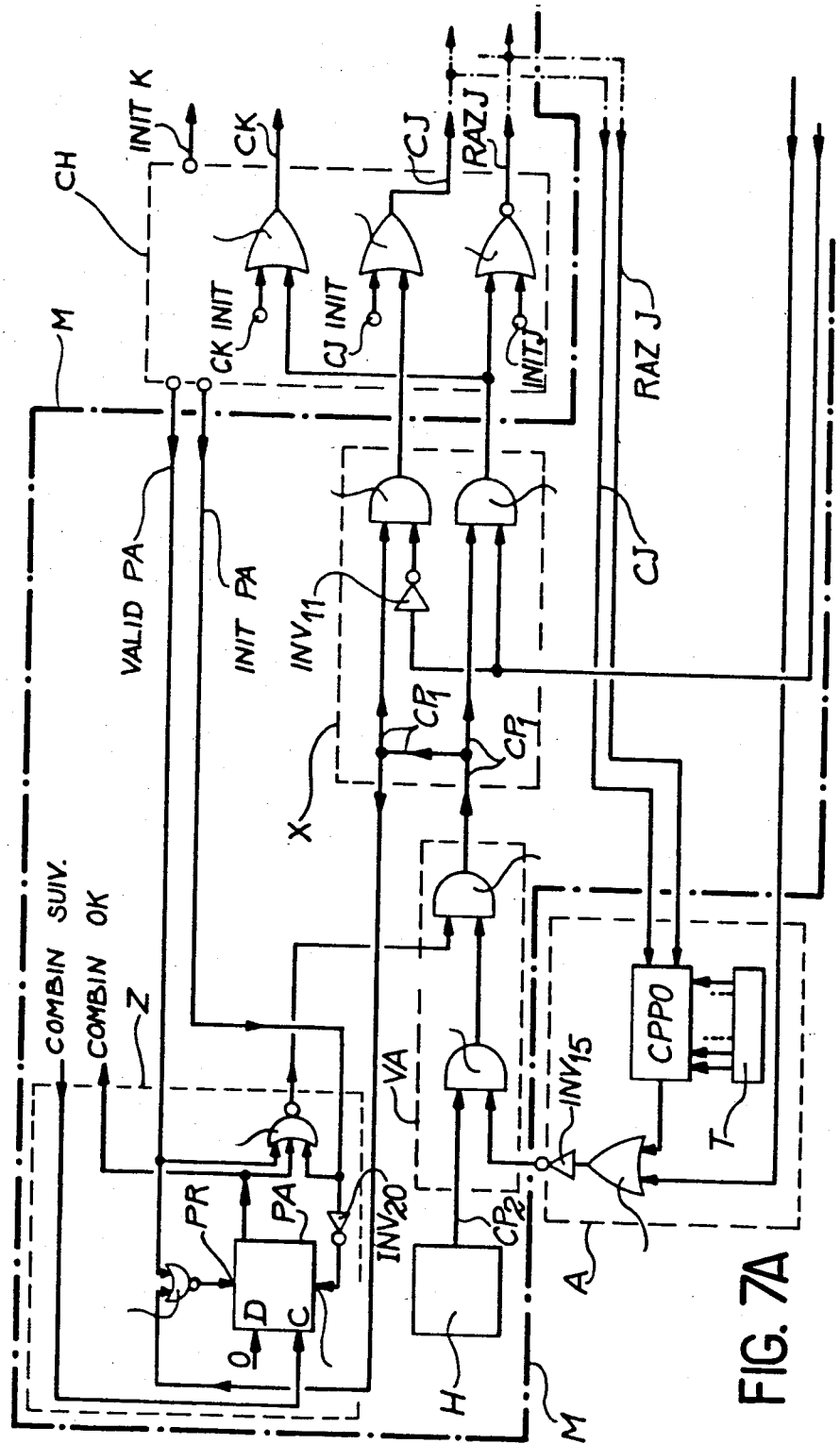
FIGS. 7A and 7B illustrate diagramatically another embodiment of the generator according to the invention.
Figure 7B:
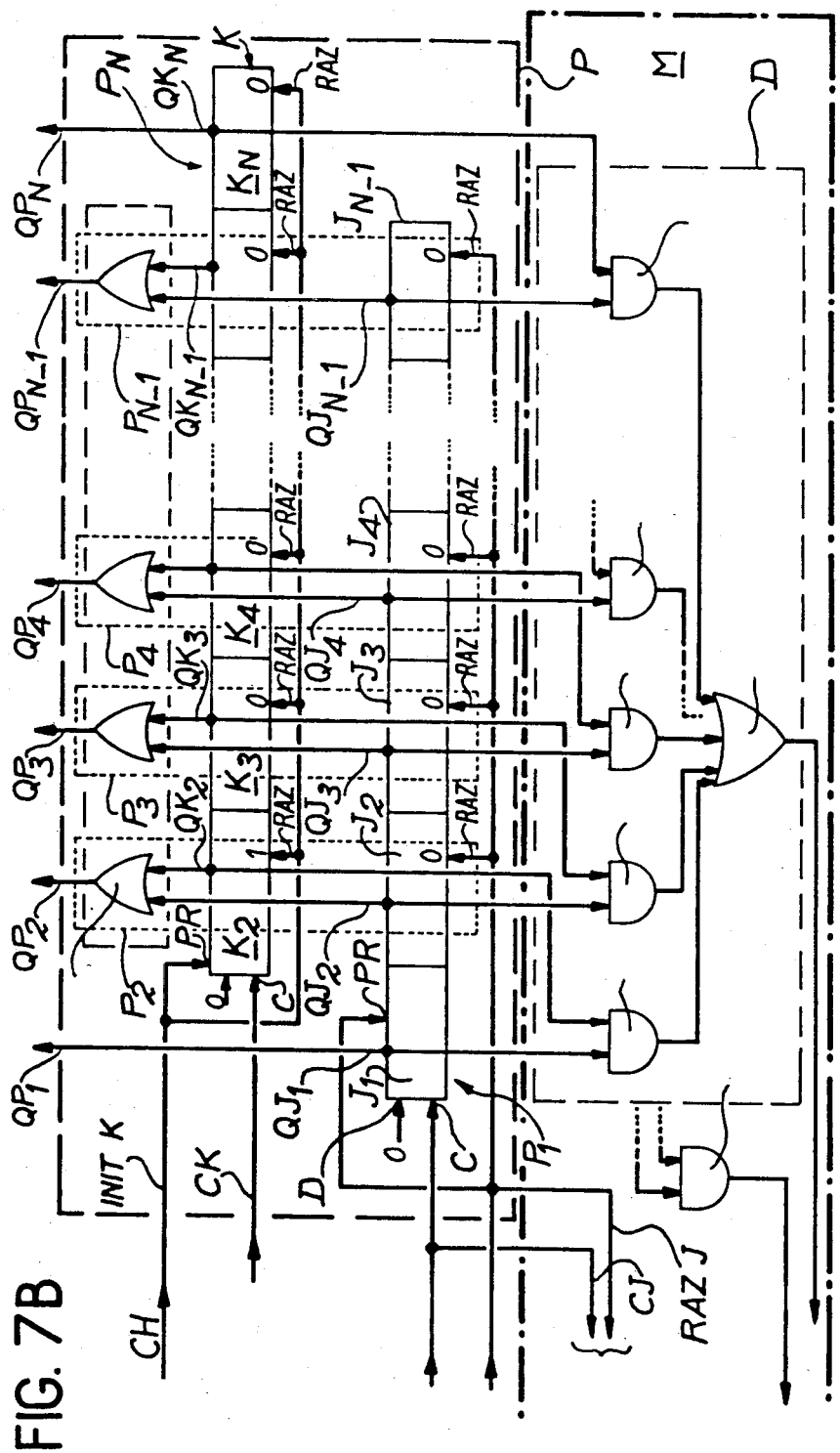

FIGS. 7a and 7b illustrate another embodiment of the combination generator according to the invention. In this next embodiment the generator allows the formation of the combinations of p=2 output signals at the logic level 1 and N-p output signals at the logic level 0 amongst the N outputs QP1, QP2 . . . QPN of the generator. In this embodiment the assembly P of the N storage means $P_1, P_2 \ldots P_N$ comprises a group of two shift register J,K formed respectively by N−1 flip-flops ($J_1, J_2 \ldots J_{N-1}$), ($K_2, K_3 \ldots K_N$). The outputs $QJ_1, QJ_2 \ldots QL_{N-1}$) of the first register J are located from 1 to N−1, while the outputs $QK_2, QK_3 \ldots QK_{N-2}$ of the second register K have the locations from 2 to N. The first output QP1 of the storage means P is formed by the output QJ1 of the first flip-flop J1 of the first register J, while the last output QPN of the storage means P is formed by the output QKN of the last flip-flop KN of the second register K. The storage assembly P also comprises an assembly E of N−2 OR-gates with two inputs. The two inputs of the gates are respectively connected to the corresponding outputs ($QJ_2, QK_2$), $QJ_3 QK_3$), . . . ($QJ_{N-1}, QK_{N-1}$), of the flip-flops of the same position ($J_2, K_2$) ($J_3, K_3$), . . . ($J_{N-1}, K_{N-1}$) of the registers J and K. Thus, for example, the first OR-gate N of the assembly E has two inputs which are respectively connected to the outputs QJ2 and QK2 of the registers J and K. Since the first output of the register J and the last output of the register K also form the first and last outputs of the storage assembly P, the assembly E comprises N−2 OR-gates. The outputs of these gates respectively form the outputs QP2, QP3 . . . $QP_{N-1}$ of the storage means P. In this embodiment the generator also comprises charging means CH which apply reinitiation signals INITK, CKINIT, CJINIT, INITJ, of zero resetting RAZJ and shifting CK,CJ to corresponding inputs of the registers J,K. The control means M are connected to the outputs $QJ_1, QJ_2, QK_2 \ldots QJ_{N-1}$ of the registers J,K, to control the generation of the combinations via the agency of the charging means CH and the stoppage means A, as will be seen in detail hereinafter.

The control means M comprise detection means D whose inputs are connected respectively to the outputs of the shift registers J.K to detect whether a flip-flop position j of the first register J and a flip-flop of position k=j+1 of the second register K are at a level 1 (j varying from 1 to N−1 and k from 2 to N). The means M also comprise control means X, one control input C of which is connected to an output of the detection means D. Outputs of the control means X are connected to control inputs of the charging means CH to control the shifts in the registers J and K. The control means CH are used in two ways: they control either a shifting by one position of the contents of the first register J if the detection means D have not detected two succesive signals of level 1 at the successive outputs of position j and k of the flip-flops of the registers J and K. They also allow the controlling of a shifting by one position of the contents of the second register K and a reinitiation of the contents of the first register J, so that the signals at the output $QJ_1$ of the first flip-flop $J_1$ of the first register J is at a level 1, and the other signals at the outputs $QJ_2$, $QJ_3 \ldots QJ_{N-1}$ of position 2 at $N-1$ of this first register J are at the level 0. The means M also comprise means Z which allow the indication by a signal COMBINOK that a combination of signals is present at the outputs QP1, QP2 ... QPN of the storage means P. These means also allow, as will be seen hereinafter, the control by a signal COMBINSUIV of the search for another combination. The means Z for indicating the presence of combinations and the control of the search for another combination receive at inputs a reinitiation signal INITPA and a validation signal VALIDPA, as will be seen in greater detail hereinafter. An output of the means Z supplies a signal COMBINOK indicating the presence of a combination available at the outputs of the storage means P. Another output of such means Z is connected to an input of a validation circuit VA; this circuit validates the operations performed by the charging means CH from pulses of a clock H whose output is connected to another input of the validation means VA. The stoppage means A have an output which is connected to another input of the validation means VA to block such validation means when the desired combinations have been obtained. As will be seen hereinafter, the stoppage means A receive a zero resetting signal RAZJ and a shift control signal CJ which are also applied to the first register J.

The detection means D are formed by an assembly of $N-1$ AND-gates $1' \ 2' \ldots _{N-1}$, located from 1 to $N-1$. The inputs of each of the gates are respectively connected to the output of the flip-flop of the same position of the register J and to the output of the flip-flop of the immediately higher position of register K. Thus, for example, the AND-gate 1 has two inputs which are respectively connected to the outputs $\Omega J_1$ of the register J and $QK_2$ of the register K. The detection assembly D also comprises an OR-gate 16 whose inputs are respectively connected to the outputs of the AND-gates of such detection assembly; the output of this gate is connected to the control input C of the control means X.

The stoppage means A are formed inter alia by a counter CPP0 charged with the value $N-2$ on each reinitiation of the first register J. The counter counts down by one unit at each shift of the contents of this first register J.

Lastly, the generator comprises a logic circuit for blocking the generation of combinations, such circuit being formed for example by the AND-gate 20 whose output is connected to an inverting amplifier INV 15 of the stoppage means A. The output of the inverting amplifier is connected to an input of an OR-gate 12, another input of which is connected to the output of the counter CPP0 of the stoppage means A. If the generator enables all the combinations of the output signals having a logic level 1 to be obtained amongst the N outputs of the generator, the AND-gate 20 has two inputs which are connected respectively to two predetermined outputs of the storage assembly P corresponding to a predetetermined combination of logic signals at a logic level 1. When this combination is reached, the AND-gate 20 allows the generation of the combinations to be stopped by blocking the clock H via the inverter INV15 and the OR-gate 12.

FIG. 8 is a table which gives all the combinations of $p=2$ logic signals at a level 1 on the five outputs of a generator according to the second embodiment of the invention. We suppose that at the start it is the two first outputs QP1, QP2 of the generator which supply signals at logic level 1, while the remaining outputs QP3, QP4, QP5 supply signals at logic level 0. These logic levels are shown on the first line of the table. As mentioned concerning the first embodiment of the invention, the means M allow the location of the storage means $P_i$ which is defined as being a means whose output signal is at the logic level 1 and which is immediately followed by the storage means $P_{i+1}$, whose output signal is at the logic level 0, i being the lowest value possible. On the first line of the table in FIG. 2, the storage means $P_i$ is the flip-flop $P_2$ (i=2), while the storage means $P_{i+1}$ is the flip-flop $P_3$ because the flip-flop $P_2$ whose output $QP_2$ signal down is at the logic level 1 is immediately followed by the flip-flop $P_3$ whose output QP3 signal is at the logic level 0. The position i is still the lowest possible, the means M enabling the first levels 1, 0 to be detected at the output QP signal of the flip-flops of the assembly P. The means M enable a succession of signals of logic level 1 to be brought on all the storage means which precede the means $P_i$ ($P_2$ in the example in question), starting with the storage means $P_i$ as far as the storage means of position N inclusive; n is equal to the number of logic levels 1 which exist on the storage means which precede the means $P_i$. In the example in question the storage means $P_i$ which precedes the means $P_2$ already has an output signal which is at the logic level 1. This output signal therefore does not change its logic level. The control means M also enables the output signal level of the storage means $P_i$ to be replaced by a logic level 0, and the logic level of the storage means $P_{i+1}$ by a logic level 1. In the example illustrated in the table in FIG. 8, it can be seen at the second line of the table that the logic level 1 of the output signal of the flip-flop $P_2$ has been replaced by a logic level 0, while the logic level 0 of the output signal the flip-flop P3 has been replaced by a logic level 1. The flip-flops which follow the flip-flop $P_{i+1}$ (P4,P5 in the example in question—second line of the table) do not change their output signal levels.

The second line of the table shows the second combination of outputs ($QP_1$, $QP_3$) of the generator, which have output signals of logic level 1, the three remaining outputs QP2, QP4, QP5 signals being at the logic level 0. For this second combination, i=1 and n=0.

As mentioned hereinbefore, the means M allow the completion of the succession of signals of logic level 1 which have been brought onto the flip-flops which precede the flip-flop $P_i$ by signals of logic level 0 brought on to all the flip-flops which follow the flip-flop of position n and precede the flip-flop of position i. Thus, for example, to pass from the third to the fourth combination of signals on the outputs of the generator (shown on the third and fourth lines of the table in FIG. 8), we start from i=3 and n=2 (third combination). The means M causes the output signal of the flip-flop P4 to pass to the logic level 1, the output signals of flip-flop P3 to the logic level 0, brings logic levels 1 onto the flip-flops which precede the flip-flop P3 except for the flip-flop P2 which is brought to the logic level 0 since it is the only flip-flop of n=2 which lies between the flip-flops of position i=3 and i=1. The fourth combination of signals is then available at the outputs QP1 and QP4 of the generator. The other combinations available at the outputs of the generator in FIGS. 7a and 7b are shown on the different lines of the table in FIG. 8; they are obtained as described hereinbefore. As before, we have supposed in this table that the predetermined starting combination is that which enables signals of level 1 to be obtained at the outputs of the first flip-flops (P1, P2) of the storage assembly P; clearly, this first predetermined starting combination might be any of those which are shown on the lines of the table in FIG. 8.

In the second embodiment of the generator (FIGS. 7a and 7b) operates as follows: we find in the register K a single signal at level 1 and in the register J a single signal at level 1; the flip-flop of the register J which contains a logic level 1 has a position which is lower than the position of the flip-flop of the register K which contains a logic level 1. The generator is reinitiated by signals INITJ and INITK supplied by the charging means CH; the flip-flops of the registers J and K being flip-flops of type D, described hereinbefore, the signal INITK is applied to the input PR of the first flip-flop $K_2$ of the register K and also to the zero resetting inputs RAZ of the flip-flops of successive following positions $K_3, \ldots K_N$. The input D of the first flip-flop $K_2$ of this register is taken to the logic level 0. The result of this is that on reinitiation the output of the flip-flop $K_2$ is at the logic level 1, while all the other flip-flops of the register K are at the logic level 0. The signal INITJ is applied to the OR-gate 12 by the charging means CH; this gate supplies the signal RAZJ on the one hand to the input PR of the first flip-flop $J_1$ of the register J, and on the other hand to the zero resetting inputs RAZ of the flip-flops of successive following positions $J_2 \ldots J_{n-1}$ of the register J. The input D of the first flip-flop $J_1$ of this register is taken to the logic level 0. It results that on reinitiation the first flip-flop $J_1$ of the register J is at the logic level 1, while all the other flip-flops $J_2 \ldots J_{n-1}$ of this register are at the logic level 0. Thus, the outputs $QP_1$ and $QP_2$ of the storage assembly P are at the logic level 1, while all the other outputs $QP_3$, $QP_n$ are at the logic level 0. This combination is therefore the first logic signals combination at a level 1 which is supplied by the generator.

The detection means D then detect that the logic level 1 of the output of the flip-flop $K_2$ of the register K immediately follows the logic level 1 of the output of signal of the flip-flop J1 of the register J. This detection then causes the search for the following combination: the register I is reinitiated so that the output signal of the flip-flop $J_1$ is at the level 1 and the output signals of the other flip-flops $J_2 \ldots J_{N-1}$ of the register are at the logic level 0; such detection also causes a shift of the content of the register K by the application to the input C of the register of a pulse CK supplied as will be seen hereinafter by an OR-gate 13 of the charging means CH. Consequently, after these operations the signals at the outputs $QP_1$ and $QP_3$ of the storage means P are at a logic level 1, while the other outputs are at the logic level 0. It is therefore the second combination which is available on the outputs of the storage assembly after the operations which have just been described. The following combination is obtained by shifting by one position the contents of the register J by a pulse CJ applied to the input C of the first flip-flop of that register; the pulse is supplied by an OR-gate 14 of the charging means CH since the detection means D, after the combination 10100 previously obtained ($QP_1=1$, $QP_2=0$, $QP_3=1$, $QP_4=0$, $QP_5=0$) detect the absence of two successive signals of level 1 on the outputs of the flip-flops of the registers J,K. This absence is expressed by a signal of logic level 0 at the output of the OR-gate 16 of the detection assembly D. The signal of logic level 0 is applied to the input of an inverting amplifier INV 11 of the control means X. The output of the inverter is connected to one of the inputs of the AND-gate 21 of the control means X; another input of this gate receives clock pulses $P_1$ coming from an output of the validation means VA. The validation means are formed by AND-gates 22 and 23; one input of the AND-gate 22 is connected to the output of the clock H which supplies pulses $CP_2$. The result is that the AND-gate 21 supplies at its output, clock pulses which are applied to the OR-gate 14 which delivers the shift pulses CJ. The shift pulses CK of the contents of the register K are obtained in the same manner from clock pulses $CP_1$ applied to one of the inputs of the AND-gate 24 of the control means X; this gate has another input which is connected to the output of the detection means D and is taken to a logic level 1, when successive signals of logic level 1 are available at the outputs of the flip-flops of the registers J and K. The output of the AND-gate 24 is connected to one of the inputs of the OR-gate 13 which supply the shift pulses CK.

To sum up, every time signals of logic level 1 follow one another on the outputs of the flip-flops of the registers J and K, the register J is reinitiated and the contents of the register K are shifted, while if the signals of level 1 available at the outputs of the registers J and K do not follow one another, all that is done is to shift the contents of the register J by applying shift pulses CJ thereto.

The generator can be reinitiated from a predetermined starting combination of signals; in that case signals of logic level 1 are propogated in the registers by the application of signals INITJ and INITK of logic level 1 to the inputs C of the first flip-flops of the registers J and K. These signals place a single level 1 in the register J and the level 1 in the register K; their application is followed by an application of pulses CJINIT, CKINIT which allow the signals of the logic level 1 to be propogated in predetermined flip-flops of the registers J and K. The stoppage means A are formed, as in the first embodiment, by a counter CPP0 which receives on the one hand the reinitiation control signal RAZJ of the shift register J and on the other hand shift control pulses CJ of the contents of the register. The counter is charged with the value N−2 on reinitiation, and every time a signal INITJ is applied to the input of the OR-gate 12 which supplies the signal RAZJ. It is charged with the value N−2 by a register T and discounts by one unit on each shift of the contents of the register J—i.e., every time a pulse CJ is applied to such register. When the contents of the counter are zero, the counter blocks the pulses $CP_2$ of the clock H via the inverter INV15, which applies signal of logic level 0 to one of the inputs of the AND-gate 22. This blocking of the clock causes the stoppage of the generation of combinations; as previously mentioned, the blocking can be performed by the AND-gate 20 and the AND-gate 15, in cases where the generation of combinations is to be stopped from a predetermined combination onwards.

When the generator just described operates from the first available combination—i.e., from that combination onwards for which the signals at the outputs $QP_1$ and $QP_2$ of the storage means P are at a logic level 1, while all the signals at the other outputs $QP_3 \ldots QP_n$ are at a logic level 0, indicating a search for combinations, (there is) a signal INITPA at the logic level 1 which is maintained to block the clock. As in the preceding embodiment, these combination search indicating means comprise a flip-flop PA of type D whose input D signal is at the logical level 0. The signal INITPA is applied to the input CLEAR of the flip-flop PA via an inverter INV 20 associated with the means Z. Consequently, the flip-flop PA reset to zero the signal COMBINOK to indicate that the combination is not present. The signal INITPA also produces the blocking of the clock H via the OR-gate 20 whose output signals is inverted before being applied to the AND-gate 23. The OR-gate 20 also receives the output signal of the flip-flop PA and the signal VALIDPA; then the charging means CH supply the signals INITJ and INITK which enable the contents of the registers J and K to be reinitiated. Lastly, the charging means CH apply the signal VALIDPA and suppress the signal INITPA while the signal VALIDPA lasts, so as to bring the signal COMBINOK to 1, to indicate that the first combination is present at the outputs of the storage means P. The signal VALIDPA is applied to the input PR of the flip-flop PA via an OR-gate 22 with inverted output belonging to the means Z.

A signal COMBINSUIV is supplied to the flip-flop PA to proceed to a search for the following combination. The flip-flop PA then allows the validation of the application of the clock pulses $CP_1$ to the control means X via the AND-gate 23 of the validation means VA. These pulses are also applied to the OR-gate 21. The clock pulse CP1 triggers via the control means X one of the following operations: either a shift of the contents of the register J if the detection means D have not detected successive signals of level 1 at the outputs of the flip-flops of the registers J and K, or a shift of the contents of the register K and a reinitiation of the contents of the register J, so that the logic level of the signals of the output $QJ_1$ of the first flip-flop $J_1$ of the register J is equal to 1 and the logic level of signals of the outputs $QJ_2 \ldots QJ_{N-1}$ of the flip-flops $QJ_{n-1}$ of the following flip-flops of that register, are equal to 0. The pulse CP1 then triggers with some delay the bringing of the signal COMBINOK to logic level 1 to indicate that a combination of signals is present. The process then starts again in the same manner with the application of the signal COMBINSUIV. The stoppage means A which comprise the counter CPP0 charged with the value $N-2$ by the register T when the signal RAZJ is applied to it count down on each pulse CJ which they receive. When the contents of this counter are equal to 0, the clock H is blocked by the inverter INV 15 and the AND-gate 22: the last combination is present at the outputs of the storage means P. The AND-gates 22 and 23 are in fact made up from synchronising circuits (of type 74120, mentioned above) so as to allow only whole clock pulses to pass.

To sum up, when the combination generator illustrated in FIGS. 7a and 7b is to supply combinations from the first combination onwards, the means Z for indication and starting control operates as follows:

the charging means CH emit the signal INIT PA which zero resets the information COMBIN OK to indicate that the combination is not presented. INIT PA is maintained at the logic level 1, so as to block the clock H via the AND-gate 23.

the means CH supply the signals INIT K then INITJ followed by CJ INIT, as indicated above.

the means CH supply VALID PA which brings to logic level 1 the information signal COMBIN OK to indicate that the first combination is present. INIT PA is then zero reset before the end of the pulse VALID PA so as to enable the flip-flop PA to logic level be put to 1 by the signal VALID PA. VALID PA blocks the clock H to enable the flip-flop PA to oscillate between the end of INIT PA and the end of VALID PA. When the flip-flop PA has passed to logic level 1, the clock H is then blocked and remains blocked by the signal COMBIN OK.

the signal COMBIN SUIV is then applied the flip-flop PA to indicate that the following combination must be sought.

the flip-flop PA then validates the clock H, which emits a pulse $CP_1$. (ET 22 and ET 23 are gates of the type described above).

this pulse $CP_1$ triggers via the control means X the search for the following combination by operating, either a transfer of K into J and the zero resetting of J1 and the shifting of K if logic level of J1=1, or a shift of J to the lowest positions if logic level of J1=0.

This pulse CP1 also after a certain delay triggers the setting to 1 of the signal COMBIN OK to indicate that the combination is present.

The process starts again with the signal COMBIN SUIV.

The stoppage means A comprises a counter CPP0 which is charged at $N-2$ which is counted down at each pulse CJ; when the contents of the counter CPP0 reaches 0 the means A block the clock, since the last combination is present.

When the generator is to generate combinations from predetermined combination onwards, it operates as follows: the control means CH apply to the flip-flop PA the signal INITPA and keep it at the logic level 1, then apply to the registers J and K the signals INITJ and INITK. Then these means supply pulses CJINIT and CKINIT to position respectively the levels 1 of the highest and the lowest weight in the corresponding flip-flops of the register J and K. The control means CH then apply the signal VALIDPA to the flip-flop PA so as to cause the appearance at the output of the flip-flop of the signal COMBINOK indicating the presence of a combination. From that moment onwards the following combinations are generated each time the flip-flop PA of the means Z receives a signal COMBINSUIV.

As in the preceding embodiment, the generator can be constructed in modular form. In that case it comprises a plurality of groups of shift registers J,K connected in series, a plurality of assemblies E of OR-gates with two inputs, associated respectively with the group of shift registers J,K and a plurality of detection means D respectively associated with the group of shift registers J,K. Each module is formed by a group of registers J,K and also by the detection means D and the assembly E of OR-gates which correspond to such groups of registers. The outputs of the assemblies E of the OR-gates are connected to the control input C of the control means X via a transistor mounted as an open collector, as described with regard to the first embodiment of the generator according to the invention.

What we claim is:

1. A combined logic signals generator for forming combinations of p output signals at the logic level 1 N-p output signals at the logic level 1 amongst N outputs (QP1, ... QPN) of the generator on which the p logic signals of level 1 and N-p logic signals of level 0 are available, N and p being constants, wherein it comprises:

an assembly (P) of N storage means (P1, P2 ... PN), the storage means being allocated position 1 to position N, the combinations of p output signals at the level 1 and N-p signals at the level 0 being supplied at the outputs (QP ... QPN) with such storage means of positions 1 to N;

means (CH) to introduce into the storage means (P1, P2 ... PN) the logic levels corresponding to a predetermined starting combination of signals;

control means (M) to locate the storage means Pi, which is defined as being a means whose output signal is at the logic level 1 and which is immediately followed by the storage means $P_{i+1}$ whose output signal is at the logic level 0, the position i being as low as possible, the means M enabling a succession of signals of logic level 1 to be brought to all the storage means which precede the means Pi, starting with a storage means of position 1 up to a means of position n inclusive, n being equal to the number of logic levels 1 existing on the storage means preceding the means Pi, such succession being completed if necessary with levels 0 after the storage means of position n and before the means of position i, the control means (M) also enabling the logic level of the storage means Pi to be replaced by a logic level 0 and the logic level of the storage means Pi+1 by a logic level 1, the repeated application of e control means M supplying the combinations which follow the predetermined combination; and means (A) to stop the generation of the combinations after another predetermined combination.

2. A generator according to claim 1, wherein such predetermined starting combination is either the first combination for which the signals of logic levels 1 are available on the outputs of the p first storage means ($P_1$, $P_2 \ldots P_p$) the output signals of the following N-p storage means ($P_{p+1}, P_{p+2} \ldots P_N$) being at the logic level 0 or any other predetermined combination of signals of logic levels 1 available at the outputs of p storage means.

3. A combination generator according to any one of claims 1 or 2, wherein the control means (M) comprises:

means R for locating the position t of certain storage means Pt and for causing the position t to evolve, said means R being connected to the introduction means CH to reinitiate t at a value such that the corresponding storage means Pt is that which follows the first storage means whose output signal is at the logic level 1, when the combination is available on the outputs QP1 to QPN;

a storage means P0 having an output QP0;

means U connected to storage means (P, Po) and to locating means (R) for causing a succession of one or more shift operations between the storage means of the assembly (P) until the logic level of the output QP0 of the storage means P0 is at the level 0, each operation performing simultaneous shifts of the logic levels of the output signals of the storage means P0 in the direction of the storage means P1 and of each of the means Pj of position j in the direction of the following means Pj+1 of position j+1, for all the means Pj whose position is between 1 and t−1, the means Pk of position k not changing their logic level for all the storage means Pk of position K higher than t, the storage means P0 being charged by the logic level of the signal at the output of the means Pt of position t during such shift operation, each operation also causing either a reinitiation of the limit t of the location and initiation means (R), on condition that the output signal of the storage means Pt is at the logic level 0 at the same time as the output signal of the means P0 is at the level 1, or an increase by one unit of the position t corresponding to the limit of location of the means (R), if the latter condition is not met, such evolution of the position t being conditioned by the logic level of the output signal of the means P0 and Pt before shifting, the fresh position t becoming effective only after shifting, the application of the means U supplying the successive combinations whose presence is determined by a level 0 of the output signal of the flip-flop QP0.

4. A generator according to claim 3, wherein the storage means ($P_1, P_2 \ldots P_N$) of the assembly P are formed by N flip-flops, forming a shift register.

5. A generator according to claim 4, wherein the means (R) for location, initiation and evolution of the position t comprises:

a shift register (F) wit N+1 flip-flops numbered 1 to N+1, such register being charged by t logic levels 1 on the first t flip-flops and by N−t+1 levels 0 on the following flip-flops, the N+1 output signals (QF1, QF2, ... QFN+1) of the register F serving to validate the shifts or to and to select the flip-flop Pt by detecting the levels transition 1, 0 on the register F to transfer the state of the flip-flop Pt in the direction of the means P0, QF1 validating the transfer between P0 and P1, WF2 validating the transfer between P1 and P2, ... , QFN validating the transfer between $P_{N-1}$ and $P_N$ and the flip-flop QFN+1 detecting the transition 1,0 whatever the value of N may be.

6. A generator according to claim 5 wherein the location and initiation means (R) also comprise means for initiating F so that T=2.

7. A generator according to claim 6 wherein the means U which cause a succession of shifting operations between the N flip-flops of the assembly P comprise a means V enabling the logic level of the output signal of the flip-flop Pt to be moved in the direction of the input of the flip-flop P0, the means V comprising for each of the flip-flops of the assembly P an AND-gate one of whose input is connected to the output $QP_b$ of the corresponding flip-flop $P_b$, for b lying between 1 and N, the other inputs of such gate being connected to the output QFb of the same position as the flip-flop $F_b$ of the register F and to the output $QF_{b+1}$ of the flip-flop Fb+1 of immediately higher position respectively, the logic level of the signal at the output of the flip-flop Pt being moved in the direction of the input of the flip-flop P0 only if the corresponding out $QF_b$ of the register F is at the logic level 1 and if the output $QF_{b+1}$ of directly higher position is at the 0 level, the means V also comprising an OR-gate whose inputs of such OR-gate transmitting to the flip-flop P0 the only logic value 0 or 1 corresponding to the logic level of the output of the flip-flop Pt and which has been detected by the transition of levels 1,0 on the output logic levels of the register F, the means U also comprising means W connected to the shift control inputs of the flip-flops of the storage assembly P and to the outputs of the shift register F which are themselves connected to the means V, to control the shift operations between flip-flops of the assembly P, and a control means X connected on the one hand to the means W via charging means CH for controlling the shift operations between the flip-flops of the assembly P and on the other hand to the output QP0 of the flip-flop P0, such means X enabling either the reinitiation of the limit t for locating the means of location and reinitiation R, or the increase of the position of such limit by one unit.

8. A generator according to claim 6, wherein the means U which cause a succession of shift operations between the N flip-flops of the assembly P comprise a means V enabling the logic level of the signal at the output Pt to be carried to the input of the flip-flop P0, the means V comprising for each of the flip-flops of the assembly P an AND-gate whose input is connected to the output $QP_b$ of the corresponding flip-flop $P_b$ for b lying between 1 and N, the other inputs of such gate being connected respectively to the outputs $QP_{b-1}$ and $QP_{b-2}$ of the flip-flops $P_{b-1}$ and $P_{b-2}$ of the assembly P and to the output $QF_b$ of the flip-flop $F_b$ of the same position of the register F, the logic level of the signal at the output of the flip-flop Pt being carried to the input of the flip-flop P0 only if the corresponding output $QF_b$ of the register F is at the level 1 and if $QP_b$ equals 1, $QP_{b-1}$ equals 1 and $QP_{b-2}$ equals 0, the means V also comprising an OR-gate whose inputs are connected to the outputs of the AND-gates, the output of the OR-gate transmitting to the flip-flop P0 the only information 0 or 1 corresponding to the logic level of the signal at the output of the flip-flop Pt which has been detected in accordance with the transition 1,0 at the logic levels of register F outputs, the means U also comprising means W connected to the means V and to the shift control inputs of the flip-flops of the storage assembly P and the outputs of the shift register F, to control the shift operations between flip-flops of the assembly P, and control means X connected via charging means CH to the shift operations control means W between the flip-flops of the assembly P and to the outputs QP0 of the flip-flop P0, said means X allowing either the reinitiation of the locating limit t of the locating and reinitiating means R, or an increase by one unit of the position of such limit.

9. A generator according to claim 7, wherein the shift control means W comprise a logic circuit means connected to the charging means (CH) and the control means to cause (X) simultaneous shifts of the logic levels of the output signal of the storage means P0 in the direction of the means P1 and of each of the means Pj in the direction of the following means Pj+1, for all the means Pj whose position lies between 1 and t−1, the means Pk not changing their output logic level for all the storage means Pk of position higher than t, the storage means Po being charged by the logic level of the output signal of the means Pt of position t during such shift operation.

10. A generator according to claim 7, wherein the means X for controlling the locating means R are connected to the charging means CH to control, via logic levels corresponding to a predetermined combination on certain storage means, the shifts between the flip-flops of the register F.

11. A generator according to claim 7, wherein the means U which cause a succession of shift operations between the flip-flops of the assembly P also comprises means Z connected to the storage means P0 to indicate that a combination is present at the outputs of the storage means of assembly P or to control the triggering of the search operations of another combination such starting indication, control means Z being also connected to the output of a clock for controlling the various shift operations and connected to the output QP0 of the flip-flop P0 so as to locate the presence of the logic level 0 of the signal at the output QP0, so as to stop the clock and indicate the presence of an available combination at p outputs of the assembly P, or so as to stop the clock again for the search for another combination, such clock being connected to stopping means A, control means X and means CH for charging the flip-flops of the assembly P, so that to control the shift operations.

12. A generator according to claim 1, wherein the means A for stopping the generation of a combinations comprise counting means CPP0 has a counter charged with the value N−1 by the charging means (CH) on the reinitiation of the position t determined by the reinitiation and location means R, such counter being activated at each increase by one unit of the position t, so that the shift operations are stopped when its contents reach 0, such counting means also comprising an AND-gate connected to the output of the counter and the output of the clock, the output of such gates controlling the shift operations via the control means X and the means CH for charging the flip-flops of the assembly P.

13. A generator according to claim 7, wherein the registers F of the means R, the flip-flops of the assembly P and the means V for taking the logic level of the output signal of the flip-flop Pt in the direction of the flip-flop P0, form a module, the generator comprising a plurality of such modules connected in cascade, so that the output of the last flip-flop of an assembly P of a module is connected to the input of the first flip-flop of the assembly P of the following module, the output of the last flip-flop of the locating means R of a module being connected to the input of the first flip-flop of the location means of the following module, each output of the OR-gates of the means V for carrying the logic level of the output signal of the flip-flop Pt in the direction of the input of the flip-flop P0 being connected to such input via a transistor mounted as an "open collector", the output P0 of the flip-flop P0 being connected to the input of the first flip-flop of the assembly P of the first module, the flip-flops of the storage means of the assemblies P of the modules and the flip-flops of the means R for locating and reinitiating the modules being connected to the charging means (CH).

14. A generator according to claim 13, wherein it also comprises a logic circuit (AND 17, OR 7) for blocking the generation of the combinations from a predetermined combination onwards, such logic circuit having inputs connected to outputs of the storage means (P) which correspond to the outputs supplying such predetermined combination, and an output for controlling the blocking of the clock (H).

15. A generator according to any one of claims 1 or 2, wherein to form the combinations of p=2 output signals, at the logic level 1 and N-p output signals at the logic level 0, amongst the N outputs (OP1 ... QPN) of the generator, the assembly p of the storage means N ($P_1$... $P_N$) comprises a group of two shift register J,k formed respectively by N−1 flip-flops (J1, ...

HN−1,K2...KN), the outputs QJ₁...QHN−1) of the first register J being allocated from 1 to N−1 and the outputs (QK₂...QKN) of the second register K being allocated from 2 to N, the first output (QP1) of the storage means P being formed by the output (QJ1) of the first flip-flop (J1) of the first register (J) and the last output (QPN) of the storage means P being formed by the output (QKN) of the last flip-flop (KN) of the second register (K), the storage assembly (P) also comprising an assembly of N−2 or OR-gates with two inputs, the two inputs of such OR-gates being connected respectively to the corresponding outputs (QJ2, QK2, QJ3,...QJN−1, QKN−1) of the flip-flops of the same position (J2,K2,J3,K3...JN−1,KN−1) of registers (J,K) the outputs of such OR-gates forming respectively the outputs (QP2...QPN−1) of the storage means P, the charging means (CH) applying reinitation, zero resetting and shift signals to the corresponding outputs of the registers (J,K) and the control means (M) being connected to the outputs of the shift registers (J,K) to control the generation of the combinations, via the agency of the charging means (CH) and the stopping means (A).

16. A generator according to claim 15, wherein the means M comprise means (D) whose inputs are connected to the outputs of the shift registers (J,K) to detect whether the output signals of a flip-flop of position j of the first register (J) and the flip-flop of position k=j+1 of the second register (K) are at a logic level 1, j varying from 1 to N−1 and k from 2 to n, control means (X) one of whose control inputs is connected to an output of the detection means (D) and outputs of which are connected to inputs for controlling the charging means (CH) to trigger either a shift by one position of the contents of the first register (J) if the detection means (D) has not detected two successive logic levels 1 at the successive outputs of position j and k of two flip-flops of the two registers (J,K) or a shift by one position of the contents of the second register (K) and a reinitiation of the contents of the first register (K) and a reinitiation of the contents of the first register (J) so that the signal of the output (QJ1) of the first flip-flop (J1) of the first register (J) is at a logic level 1 and the other signals at the outputs (QJ2...QJN−1) of position 2 to N−1 of the first register (J) are at a logic level 0, means (Z) to indicate that a combination is present at the outputs (QP1...QPN) of the storage means (P) or to control the search for another combination, such means (Z) for indicating and controlling the search for combinations receiving at inputs, signals of reinitiation, validation or control of the search for another combination, one output of such means supplying a signal indicating the presence of a combination at the outputs of the storage means (P), another output of such means being connected to an input of a validation circuit (VA) of the operations carried out by the charging means (CH) from pulses of a clock (E) whose output is connected to another input of the validation means (VA), the stoppage means (A) having an output which is connected to another input of the validation means (VA) to block such validation means when the desired combinations have been obtained, such stoppage means (A) receiving at inputs, the reinitiation and shift control signals applied to the first register (J).

17. A generator according to claim 16, wherein the detection means (D) are formed by N−1 AND-gates with two inputs, such gates being allocated from 1 to N−1, the inputs of each gate being connected respectively to the output of the flip-flop of the same position in the register J and to the output of the flip-flop of immediately higher position of the register K, the outputs of such AND-gates being connected to the inputs of an OR-gate whose output is connected to the input for controlling the control means (X).

18. A generator according to claim 17, wherein the stoppage means (A) are formed by a counter charged to the value N−1 at each reinitiation of the first register (J) such counter counting down by one unit at each shift of the contents of the first register (J).

19. A generator according to claim 18, wherein the generator also comprises a logic circuit for blocking the generation combinations from a predetermined combination onwards, such logic circuit having inputs connected to outputs of the storage means (P) corresponding to the outputs supplying such predetermined combination, and an output for controlling the blocking of the clock (H).

20. A generator according to claim 19, wherein said generator also comprises a plurality of groups of registers (J) and (K) connected in series, a plurality of assemblies of OR-gates with two inputs associated respectively with the groups of shift registers (J,K) and a plurality of detection means (D) associated respectively with the groups of shift registers (J,K) a group of registers (J,K) and also the detection means (D) and the assembly of OR-gates which correspond to such group forming a module, the outputs of the OR-gates of the dection means (D) being connected to the input for controlling the control means (X) by means of a transistor mounted as an open collector.

* * * * *